United States Patent
Ku et al.

(10) Patent No.: US 10,756,763 B2
(45) Date of Patent: Aug. 25, 2020

(54) SYSTEMS AND METHODS FOR DECODING BOSE-CHAUDHURI-HOCQUENGHEM ENCODED CODEWORDS

(71) Applicant: INNOGRIT TECHNOLOGIES CO., LTD., Shanghai (CN)

(72) Inventors: Fang-Ju Ku, Zhubei (TW); Yu-Cheng Lan, Yilan (TW); Wen-Chang Chao, Hsinchu (TW); Yuan-Mao Chang, Hsinchu (TW)

(73) Assignee: INNOGRIT TECHNOLOGIES CO., LTD., Shanghai (CN)

(*) Notice: Subject to any disclaimer, the term of this patent is extended or adjusted under 35 U.S.C. 154(b) by 0 days.

(21) Appl. No.: 16/145,377

(22) Filed: Sep. 28, 2018

(65) Prior Publication Data
US 2020/0106460 A1 Apr. 2, 2020

(51) Int. Cl.
*H03M 13/00* (2006.01)
*H03M 13/15* (2006.01)
*H03M 13/45* (2006.01)

(52) U.S. Cl.
CPC ....... *H03M 13/152* (2013.01); *H03M 13/154* (2013.01); *H03M 13/157* (2013.01); *H03M 13/1545* (2013.01); *H03M 13/1575* (2013.01); *H03M 13/45* (2013.01); *H03M 13/6586* (2013.01)

(58) Field of Classification Search
None
See application file for complete search history.

(56) References Cited

U.S. PATENT DOCUMENTS

| | | | | |
|---|---|---|---|---|
| 6,031,875 A * | 2/2000 | Im | ......................... | H03M 13/151 375/262 |
| 6,058,500 A * | 5/2000 | DesJardins | ......... | H03M 13/151 714/781 |
| 6,539,515 B1 * | 3/2003 | Gong | ................ | H03M 13/1515 714/781 |
| 7,788,570 B1 * | 8/2010 | Feng | ................. | H03M 13/1515 714/784 |

(Continued)

OTHER PUBLICATIONS

R. Dill, A. Shrivastava and H. Oh, "Optimization of multi-channel BCH error decoding for common cases," 2015 International Conference on Compilers, Architecture and Synthesis for Embedded Systems (CASES), Amsterdam, 2015, pp. 59-68. (Year: 2015).*

*Primary Examiner* — Daniel F. McMahon
(74) *Attorney, Agent, or Firm* — Metis IP LLC

(57) ABSTRACT

The present disclosure relates to methods and systems for decoding a Bose-Chaudhuri-Hocquenghem (BCH) encoded codeword. The methods-may include receiving a codeword over a data channel; determining a plurality of syndrome values for the codeword during a first time interval; determining a set of initial elements during the first time interval; generating an error locator polynomial based on the plurality of syndrome values, the error locator polynomial representing one or more errors in the codeword; evaluating, based on the set of initial elements, the error locator polynomial to identify one or more error locations corresponding to the one or more errors in the codeword; and correcting the codeword based on the one or more error locations.

20 Claims, 13 Drawing Sheets

(56) References Cited

U.S. PATENT DOCUMENTS

| | | | |
|---|---|---|---|
| 2001/0037483 A1* | 11/2001 | Sankaran | H03M 13/1515 |
| | | | 714/782 |
| 2004/0181735 A1* | 9/2004 | Xin | H03M 13/152 |
| | | | 714/758 |
| 2009/0158118 A1* | 6/2009 | Andreev | H03M 13/1515 |
| | | | 714/755 |
| 2011/0055668 A1* | 3/2011 | Kim | H03M 13/152 |
| | | | 714/782 |
| 2017/0004036 A1* | 1/2017 | Ha | G11C 29/52 |
| 2017/0077962 A1* | 3/2017 | Yang | H03M 13/1545 |

* cited by examiner

| Power representation | Polynomial representation | 4-Tuple representation |
|---|---|---|
| 0 | 0 | (0 0 0 0) |
| 1 | 1 | (0 0 0 1) |
| $\alpha$ | $\alpha$ | (0 0 1 0) |
| $\alpha^2$ | $\alpha^2$ | (0 1 0 0) |
| $\alpha^3$ | $\alpha^3$ | (1 0 0 0) |
| $\alpha^4$ | $1 + \alpha$ | (0 0 1 1) |
| $\alpha^5$ | $\alpha + \alpha^2$ | (0 1 1 0) |
| $\alpha^6$ | $\alpha^2 + \alpha^3$ | (1 1 0 0) |
| $\alpha^7$ | $1 + \alpha + \alpha^3$ | (1 0 1 1) |
| $\alpha^8$ | $1 + \alpha^2$ | (0 1 0 1) |
| $\alpha^9$ | $\alpha + \alpha^3$ | (1 0 1 0) |
| $\alpha^{10}$ | $1 + \alpha + \alpha^2$ | (0 1 1 1) |
| $\alpha^{11}$ | $\alpha + \alpha^2 + \alpha^3$ | (1 1 1 0) |
| $\alpha^{12}$ | $1 + \alpha + \alpha^2 + \alpha^3$ | (1 1 1 1) |
| $\alpha^{13}$ | $1 + \alpha^2 + \alpha^3$ | (1 1 0 1) |
| $\alpha^{14}$ | $1 + \alpha^3$ | (1 0 0 1) |

FIG. 13

SYSTEMS AND METHODS FOR DECODING BOSE-CHAUDHURI-HOCQUENGHEM ENCODED CODEWORDS

TECHNICAL FIELD

The present disclosure generally relates to systems and methods for decoding codewords, and more specifically, to systems and methods for decoding a Bose-Chaudhuri-Hocquenghem (BCH) encoded codeword.

BACKGROUND

Generally, a BCH decoder may decode a BCH encoded codeword by passing through three stages. In the first stage, a syndrome calculation circuit may perform syndrome calculation on the codeword. In the second stage, an error locator calculator may generate an error locator polynomial representing error locations in the codeword. In the third stage, a Chien search circuit may identify the error locations in the codeword by finding roots of the error locator polynomial. It is well known that one of the most time-consuming stages is finding roots of the error locator polynomial by the Chien search circuit in the third stage. When the number of data bits of the codeword (e.g., denoted by n) is smaller than a preset value (e.g., denoted by $2^m-1$ of $GF(2^m)$), the processing of the $2^m-n$ bits (bits that are most significant bits of $GF(2^m)$ and may be padded on the left side of the n data bits of the codeword) in the third stage may need extra time and thus, causing latency. It is important to skip processing the $2^m-1-n$ bits in the third stage to save latency. In addition, a parallel Chien search circuit (a Chien search circuit that can process more than one bit in a clock cycle) may be implemented in the BCH decoder for a good decoding performance (e.g., a high decoding throughput). The parallel Chien search circuit may be the most area consuming part of the BCH decoder. To develop an area-efficient BCH decoder that yields both low complexity and good decoding performance, it is desirable to reduce the complexity of the parallel Chien search circuit.

SUMMARY

According to an aspect of the present disclosure, a method for decoding a Bose-Chaudhuri-Hocquenghem (BCH) encoded codeword is provided. The method may include receiving a codeword over a data channel. The codeword may be encoded with a first number of data bits and the first number may be not greater than a preset value. The method may also include determining a plurality of syndrome values for the codeword during a first time interval. The method may also include determining a set of initial elements during the first time interval. The set of initial elements may be associated with a difference between the preset value and the first number. The method may also include generating an error locator polynomial based on the plurality of syndrome values. The error locator polynomial may represent one or more errors in the codeword. The method may also include evaluating, based on the set of initial elements, the error locator polynomial to identify one or more error locations corresponding to the one or more errors in the codeword. The method may further include correcting the codeword based on the one or more error locations.

In some embodiments, determining the plurality of syndrome values for the codeword during the first time interval may further include determining, in each cycle of a plurality of first cycles within the first time interval, an intermediate syndrome value corresponding to a first preset number of data bits of the codeword; and determining each of the plurality of syndrome values based on the intermediate syndrome value corresponding to the first number of data bits. The plurality of first cycles may be associated with the first number of data bits and the first preset number of data bits.

In some embodiments, determining the set of initial elements during the first time interval may further include initializing a set of first registers to a set of values, each first register corresponding to one of the set of initial elements; determining, based on the first preset number of data bits, a power of a primitive element corresponding to each first register; for each cycle of a plurality of first cycles within the first time interval, updating each first register by multiplying a current value of the first register with the corresponding power of the primitive element; and determining the set of initial elements based on the updated values of the set of first registers.

In some embodiments, the number of the plurality of first cycles may be smaller than a ratio of the difference between the preset value and the first number to the first preset number of data bits.

In some embodiments, evaluating the error locator polynomial to identify one or more error locations corresponding to the one or more errors in the codeword may include determining, in each cycle of a plurality of second cycles, a second preset number of values; and evaluating, based on the second preset number of values, the error locator polynomial to identify one or more error locations corresponding to the one or more errors in the codeword. Each of the second preset number of values may correspond to one data bit of the codeword, and the plurality of second cycles may be associated with the first number of data bits and the second preset number of values.

In some embodiments, evaluating the error locator polynomial to identify one or more error locations corresponding to the one or more errors in the codeword may include initializing a set of second registers to a set of initial values. The set of initial values may be associated with the set of initial elements and a set of coefficients of the error locator polynomial. In some embodiments, determining one of the second preset number of values in a second cycle may include determining values of the set of second registers; multiplying the value of each second register with a corresponding power of the primitive element to produce a set of products; summing the set of products with a coefficient of the error locator polynomial to produce an evaluation value of the error locator polynomial; and determining the one of the second preset number of values in the second cycle based on the evaluation value. A value of each second register may be associated with the initial value of the second register and a corresponding power of a primitive element and the corresponding power of the primitive element may be associated with a sequence number of the second cycle.

In some embodiments, multiplying the value of each second register with the corresponding power of the primitive element may include shifting the value of the second register by a number of bits associated with the corresponding power of the primitive element. Summing the set of products with a coefficient of the error locator polynomial to produce an evaluation value of the error locator polynomial may include summing the shifted values of the second registers with the coefficient of the error locator polynomial to produce the evaluation value of the error locator polynomial.

In some embodiments, the method may further include performing, based on a primitive polynomial, a modulo operation on the evaluation value of the error locator polynomial to transform the evaluation value to a preset number of bit value.

In some embodiments, performing the modulo operation on the evaluation value may include mapping each bit of the evaluation value to a corresponding polynomial including one or more powers of the primitive element based on a position of the bit in the evaluation value; and summing the polynomials corresponding to all bits of the evaluation value to produce a summation value.

In some embodiments, identifying the one or more error locations corresponding to the one or more errors in the codeword may include determining, for each of the first number of data bits, a corresponding value of the error locator polynomial to identify the one or more error locations corresponding to the one or more errors in the codeword.

According to another aspect of the present disclosure, a decoder for decoding a Bose-Chaudhuri-Hocquenghem (BCH) encoded codeword is provided. The decoder may include a receiving module configured to receive a codeword over a data channel. The codeword may be encoded with a first number of data bits and the first number may be not greater than a preset value. The decoder may also include a syndrome calculation module configured to determine a plurality of syndrome values for the codeword during a first time interval. The decoder may also include an error locator polynomial module configured to generate an error locator polynomial based on the plurality of syndrome values. The error locator polynomial may represent one or more errors in the codeword. The decoder may also include an error location determination module. The error location determination module may be configured to determine a set of initial elements during the first time interval; and evaluate, based on the set of initial elements, the error locator polynomial to identify one or more error locations corresponding to the one or more errors in the codeword. The set of initial elements may be associated with a difference between the preset value and the first number. The decoder may further include an error correction module configured to correct the codeword based on the one or more error locations.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities, and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. These embodiments are non-limiting exemplary embodiments, in which like reference numerals represent similar structures throughout the several views of the drawings, and wherein:

FIG. 13 is a table illustrating exemplary representations for elements of $GF(2^4)$ according to some embodiments of the present disclosure.

DETAILED DESCRIPTION

Figure 1:
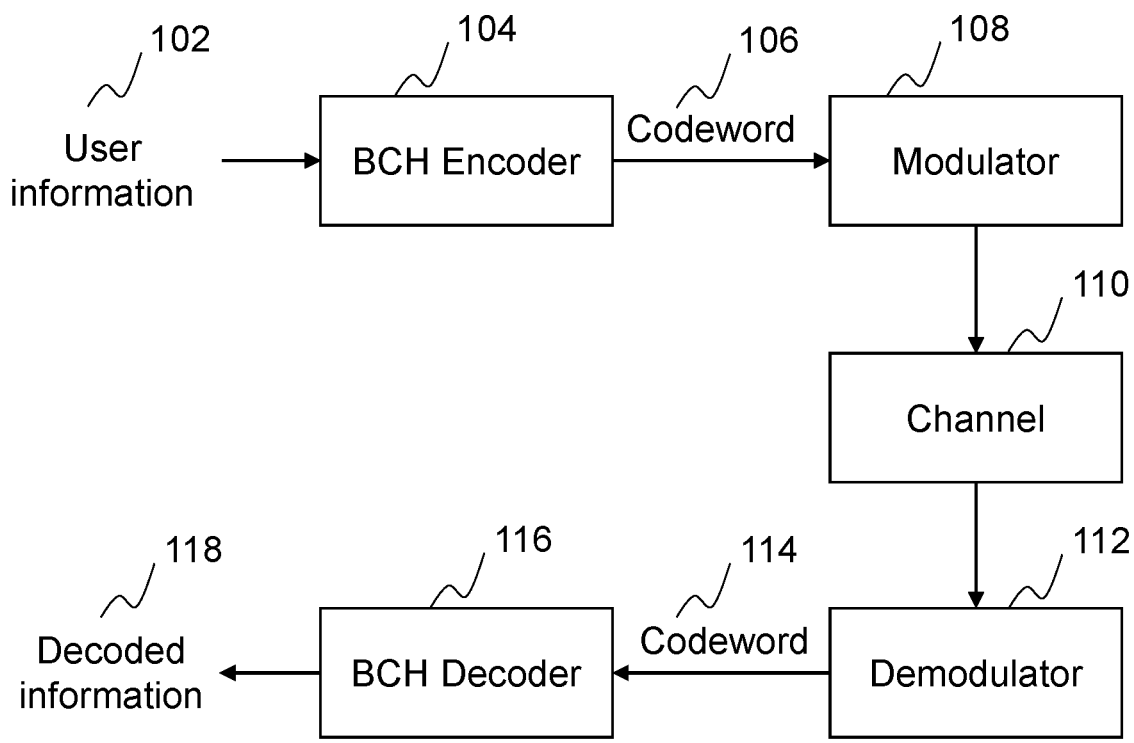
FIG. 1 is a schematic diagram illustrating an exemplary communication system according to some embodiments of the present disclosure.

The following description is presented to enable any person skilled in the art to make and use the present disclosure and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown but is to be accorded the widest scope consistent with the claims.

The terminology used herein is for the purpose of describing particular exemplary embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that the term "system," "engine," "unit," and/or "module" used herein are one method to distinguish different components, elements, parts, section or assembly of different level in ascending order. However, the terms may be displaced by another expression if they achieve the same purpose.

It will be understood that when a unit, engine or module is referred to as being "on," "connected to," or "coupled to," another unit, engine, or module, it may be directly on, connected or coupled to, or communicate with the other unit, engine, or module, or an intervening unit, engine, or module may be present, unless the context clearly indicates otherwise. As used herein, the term "and/or" includes any and all combinations of one or more of the associated listed items.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of the present disclosure. It is to be expressly understood, however, that the drawings are for the purpose of illustration and description only and are not intended to limit the scope of the present disclosure. It is understood that the drawings are not to scale.

The flowcharts used in the present disclosure illustrate operations that systems implement according to some embodiments of the present disclosure. It is to be expressly understood, the operations of the flowcharts may be implemented not in order. Conversely, the operations may be implemented in inverted order, or simultaneously. Moreover, one or more other operations may be added to the flowcharts. One or more operations may be removed from the flowcharts.

In the present disclose, the encoding process for user information or the decoding process for a codeword is a process over a Galois filed (e.g., $GF(2^m)$). Operations (e.g., addition/summation, subtraction, multiplication) performed during the encoding or decoding process are defined over the Galois filed. For example, an addition/summation operation corresponds to a logical exclusive OR (XOR) operation. As another example, a multiplication operation corresponds to a logical AND operation.

An aspect of the present disclosure relates to systems and methods for decoding a BCH encoded codeword. On the one hand, the BCH encoded codeword may be encoded with a first number of data bits using a binary BCH code over a Galois filed denoted by $GF(2^m)$. The first number of data bits may be smaller than a preset value of $GF(2^m)$. The difference between the preset value and the first number may be referred to as a second number. With the systems and the methods disclosed in the present disclosure, in the stage of identifying error locations by evaluating an error locator polynomial (including determining values of the error locator polynomial, determining whether the values are equal to zeros, etc.), the processing or checking of the second number of bits (which may take ρ cycles) may be skipped. The ρ cycles may be associated with a ratio of the second number of bits to the number of bits that the BCH decoder process in a cycle. However, the calculation of repeated multiplication of a corresponding power of a primitive element for ρ cycles (called initial elements) are needed for the evaluation of the error locator polynomial corresponding to the first number of data bits of the codeword. The systems and the methods may pre-calculate the initial elements in the stage of syndrome calculation, which may take σ cycles. The σ cycles may be associated with a ratio of the first number of data bits to the number of bits that the BCH decoder process in a cycle. The systems and the methods may guarantee that the initial elements can always be obtained or calculated within the σ cycles, even if ρ is greater than σ. By pre-calculating the initial elements in the stage of syndrome calculation, the ρ cycles at the stage of identifying error locations are saved. Thus the BCH decoder may save latency in the stage of identifying error locations. On the other hand, in the BCH decoder, the Chien search circuit may be the most area consuming part. With the systems and the methods disclosed in the present disclosure, the BCH decoder may replace a plurality of multipliers in the Chien search circuit with corresponding shifters, which may reduce the area of the BCH decoder. Further, a plurality of mod operators may be used to transform shifted values back to m-bit values.

FIG. 1 is a schematic diagram illustrating an exemplary communication system 100 according to some embodiments of the present disclosure. As illustrated in FIG. 1, the communication system 100 may include a BCH decoder 104, a modulator 108, a channel 110, a demodulator 112, and a BCH decoder 116.

The BCH encoder 104 may encode user information 102 to generate a codeword 106. The user information 102 may be provided by an information source (not shown). The information source may include for example, a source encoder, an electrical storage device, an optical storage device, a magnetic storage device, etc. The user information 102 may include k bits of data, each of which may be referred to as a user bit (or a message bit, or an information bit). Each bit of the user information 102 may be a binary bit, a decimal bit, a hexadecimal bit, or any other suitable type of data. For brevity, the methods and/or systems described in the present disclosure may take a binary bit as an example. It should be noted that the binary bit is merely provided for the purposes of illustration, and not intended to limit the scope of the present disclosure. For persons having ordinary skills in the art, the methods and/or systems described in the present disclosure may be applied to other similar situations, such as a decimal bit, a hexadecimal bit, etc. The codeword 106 may be a block code encoded with n data bits. The BCH encoder 104 may add p (p=n−k, n>k) redundant bits to the k user bits to generate the n data bits of the codeword 106, where n and k are appropriate positive integers. In the codeword 106, p redundant bits are added to the end of the k user bits. The term "redundant bit," "parity bit," and "check bit" in the present disclosure are used interchangeably to refer to a bit that is used to detect and correct errors in the codeword (e.g., a codeword 114) received at the receiver side of the communication system 100 (e.g., the demodulator 112, the BCH decoder 116).

In some embodiments, the BCH encoder 104 may encode the user information 102 using a binary BCH code over a Galois filed denoted by $GF(2^m)$ (m is a positive integer). For example, the BCH encoder 104 using an (n, k, t) binary BCH code over $GF(2^m)$ may encode k user bits into an n-bit codeword. The number of data bits of the codeword 106 may be not greater than a preset value of $GF(2^m)$ (denoted by $2^m-1$), i.e., $n \leq 2^m-1$. The number of parity bits of the codeword 106 may be not greater than mt, i.e., n−k≤mt. t may be referred to as the correction power of the binary BCH code, and is equal to the maximum number of errors that is correctable in a codeword. The binary BCH code has the minimum distance $d_{min}$, which is not smaller than 2t+1, i.e., $d_{min} \geq 2t+1$.

In some embodiments, the user information 102 or the codeword 106 may be represented as a polynomial. For example, the user information 102 may include k bits $(u_{k-1}, \ldots, u_2, u_1, u_0)$ ($u_i \in \{0, 1\}$, i=0, 1, 2, ..., k−1). The polynomial corresponding to the user information 102 may be represented as $u(x)=u_0+u_1x+u_2x^2+ \ldots +u_{k-1}x^{k-1}$. The coefficients of the polynomial u(x) are the bits of the user information 102, where $u_0$ is a coefficient for $x^0$, $u_1$ is a coefficient for $x^1$, $u_2$ is a coefficient for $x^2$, ..., and $u_{k-1}$ is a coefficient for $x^{k-1}$. The codeword 106 may include n bits $(v_{n-1}, \ldots, v_2, v_1, v_0)$ $(v_i \in \{0, 1\}, i=0, 1, 2, \ldots, n-1)$. The polynomial corresponding to the codeword 106 may be represented as $v(x)=v_0+v_1x+v_2x^2+ \ldots +v_{n-1}x^{n-1}$. The process of encoding the user information 102 to generate the codeword 106 may correspond to the process of transforming the polynomial u(x) to the polynomial v(x). Specifically, the BCH encoder 104 may multiply the polynomial u(x) by $x^{n-k}$ to raise the power of the polynomial u(x) to correspond to the power of the polynomial v(x). The product of u(x) times $x^{n-k}$ is modulo divided by a generator polynomial g(x) of the binary BCH code. The generator polynomial g(x) is the least common multiple of one or more minimal polynomial of $\alpha$, $\alpha^2$, $\alpha^3$, $\alpha^{2t}$, where $\alpha$ is a primitive element of $GF(2^m)$. The reminder of the modulo division of the product (i.e., u(x) times $x^{n-k}$) by the generator polynomial g(x) is summed with the product of u(x) times $x^{n-k}$ to produce the polynomial v(x). For example, a binary string (1 1 0 1) (the most significant bit corresponds to the leftmost bit of the string) may be exemplary user information 102. The binary string may be converted into a corresponding polynomial $u(x)=1+x^2+x^3$. For a (7, 4) BCH code, the corresponding generator polynomial g(x) may be represented as $g(x)=1+x+x^3$. The polynomial u(x) is multiplied by $x^{n-k}$ (n−k equals 3) to produce a result of $x^3+x^5+x^6$. The result is then divided by $1+x+x^3$, producing a remainder of 1. Adding the remainder to the product of $u(x)*x^{n-k}$ produces a polynomial $v(x)=1+x^3+x^5+x^6$. The polynomial $v(x)=1+x^3+x^5+x^6$ corresponds to a binary block code (1 1 0 1 0 0 1) of the codeword 106.

The modulator 108 may modulate the codeword 106 into one or more signals carrying the information of the codeword 106. Exemplary modulation technologies may include a phase-shift keying (PSK) technology, a binary PSK (BPSK) technology, a frequency-shift keying (FSK) modulation technology, a quadrature amplitude modulation technology, or the like, or any combination thereof.

The channel 110 may facilitate transmission of information and/or data. The one or more signals generated by the modulator 108 may be transmitted over the channel 110. The channel 110 may include a wired channel and/or a wireless channel. The wired channel may be a medium such as a twisted-pair wire, a cable (e.g., a coaxial cable, a symmetrical cable), a telephone wire, an optical fiber, a waveguide, an optical disk, a magnetic disk, a solid state disk, etc. The wireless channel may be a medium such as a microwave signal (e.g., an RF signal, an infrared signal). Due to interference signals and other types of noise and phenomena (e.g., a device physical failure, a device electrical failure, a data loss due to buffer overflow, channel degradation), the channel 110 may corrupt the one or more signals transmitted from the modulator 108. Thus, the signals received by the demodulator 112 may be different from the originally transmitted signals from the modulator 108. In some embodiments, the channel 110 may also include the modulator 108 and/or the demodulator 112.

The demodulator 112 may demodulate signals received from the channel 110 into the codeword 114. The demodulator 112 may demodulate the signals according to a demodulation technology corresponding to the modulation technology used in the modulator 108. For example, if the modulator 108 modulates the codeword 106 based on a PSK modulation technology, the demodulator 112 may demodulate the signals received based on a PSK demodulation technology. In some embodiments, the codeword 114 may be different from the codeword 106 and may include bit errors introduced by, for example, degradations of the channel 110. As used herein, the term "error" may refer to portions of information that have been altered or lost. For example, a data bit in the codeword 114 may be an erroneous bit if the bit value is different from that of the corresponding bit in the codeword 106, or the bit value is unknown. The demodulator 112 may transmit the codeword 114 to the BCH decoder 116 for correcting errors in the codeword 114.

The BCH decoder 116 may decode the codeword 114 received from the demodulator 112. The BCH decoder 116 may decode the codeword 114 using the (n, k, t) binary BCH code employed by the BCH encoder 104. The codeword 114 may be represented as a polynomial. For example, the codeword 114 may include n bits $(r_{n-1}, \ldots, r_2, r_1, r_0)$ $(r_i \in \{0, 1\}, i=0, 1, 2, \ldots, n-1)$. The polynomial corresponding to the codeword 114 may be represented as $r(x)=r_0+r_1x+r_2x^2+ \ldots +r_{n-1}x^{n-1}$. During the decoding of the codeword 114, the BCH decoder 116 may determine whether the codeword 114 is a valid codeword by calculating 2t syndrome values for the codeword 114. A syndrome value denoted by $S_j$ (j=1, 2, ..., or 2t) may correspond to a reminder of the polynomial r(x) divided by a polynomial denoted by $\phi_j(x)$, where the polynomial $\phi_j(x)$ is the minimal polynomial of $\alpha^j$. If all the 2t syndrome values are equal to zeros, the BCH decoder 116 may determine that the codeword 114 is a valid codeword. If at least one of the 2t syndrome values is not equal to zero, the BCH decoder 116 may determine that the codeword 114 is not a valid codeword. As used herein, a valid codeword may include no errors or the errors present form another valid codeword, and are thus undetectable.

If the codeword 114 is a valid codeword, the BCH decoder 116 may decode the codeword 114 to obtain decoded information 118, which may be the same as the user information 102. For example, the BCH decoder 116 may obtain the decoded information 118 by extracting the user bits (e.g., k user bits) of the codeword 114.

If the codeword 114 is not a valid codeword, the BCH decoder 116 may detect and correct errors in the codeword 114. For example, in the binary BCH decoding, the BCH decoder 116 may identify error locations corresponding to the erroneous bits in the codeword 114. The BCH decoder 116 may then correct the erroneous bits by performing bit flipping operations on the erroneous bits. The BCH decoder 116 may decode the codeword 114 to generate the decoded information 118, which may or may not include errors. If there are no errors in the decoded information 118, the decoded information 118 may be the same as the user information 102. Otherwise, the decoded information 118 may be different from the user information 102. In some embodiments, the BCH decoder 116 may not be able to correct all errors in the codeword 114. For example, when the number of errors in the codeword 114 exceeds the correction power t of the BCH code, the BCH decoder 116 may not be able to correct all errors in the codeword 114. Consequently, the decoded information 118 may still include errors and may be different from the user information 102.

In some embodiments, the BCH decoder 116 may use a decoding algorithm to detect and correct the errors in the codeword 114. Exemplary decoding algorithm may include a BerlekampMassey algorithm, a Chien search algorithm, a Peterson-Gorenstein-Zierler algorithm, a Euclidean algorithm, etc. Detailed descriptions of the decoding of the BCH decoder 116 may be found elsewhere in the present disclosure (e.g., FIGS. 2-13 and the descriptions thereof).

It should be noted that above description is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure. In some embodiments, the application scenario illustrated in FIG. 1 is only provided for illustration purposes, and not intended to limit the scope of the present disclosure. For example, the communication system 100 may be used as a data storage system. The data storage system may include a data source (e.g., the BCH encoder 104, and/or the modulator 108), a data destination (e.g., the BCH decoder 116, and/or the demodulator 112), and a storage medium (the channel 110). Data from the data source may be stored in the storage medium, and then retrieved in the data destination. The data storage system may correct errors introduced by for example, the storage medium, according to the process and/or method described in the present disclosure. In some embodiments, the modulator 108 and/or the demodulator 112 may be integrated into the channel 110.

Figure 2:
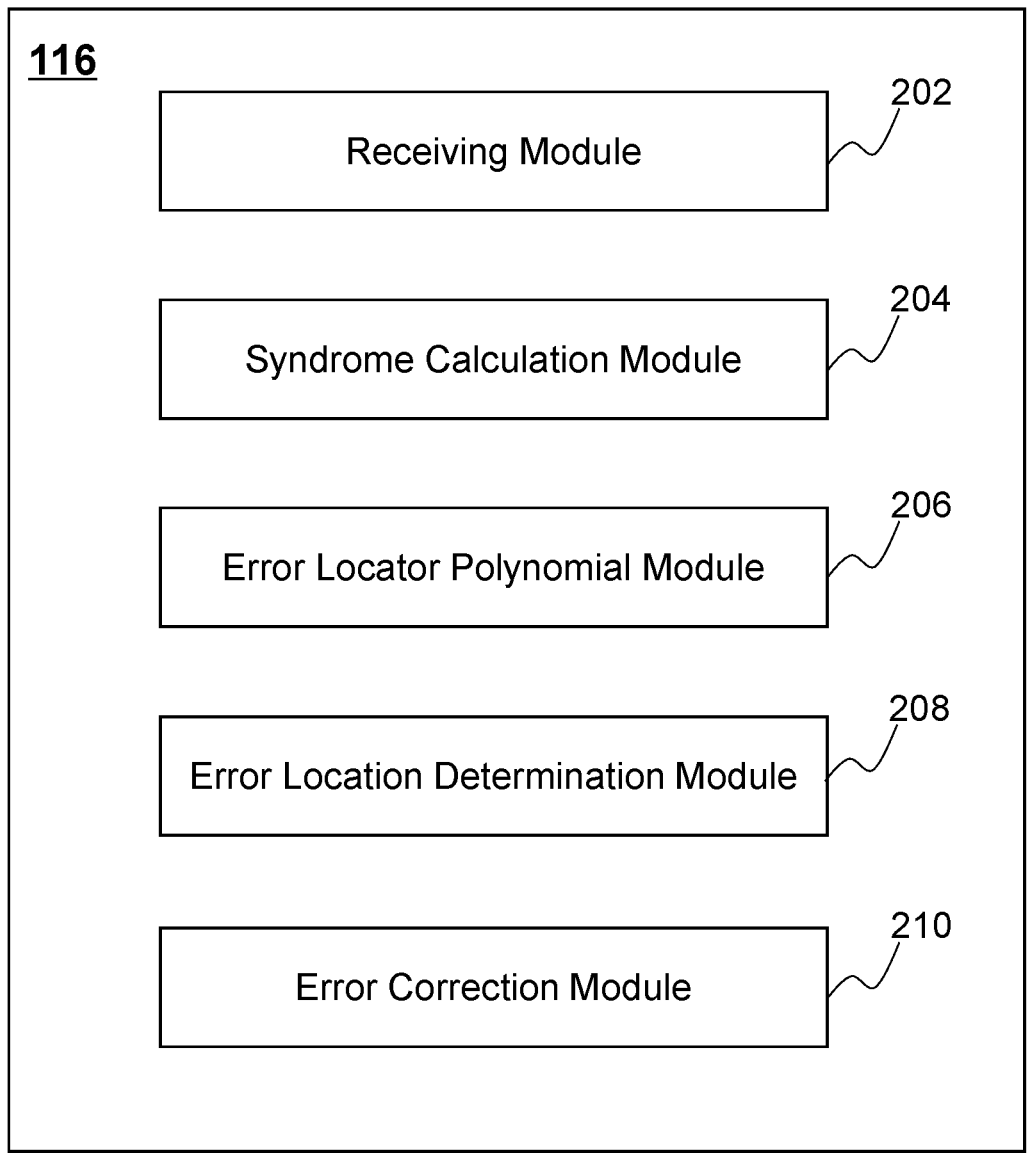
FIG. 2 is a block diagram illustrating an exemplary BCH decoder according to some embodiments of the present disclosure.

FIG. 2 is a block diagram illustrating an exemplary BCH decoder 116 according to some embodiments of the present disclosure. As illustrated in FIG. 2, the BCH decoder 116 may include a receiving module 202, a syndrome calculation module 204, an error locator polynomial module 206, an error location determination module 208, and an error correction module 210.

The receiving module 202 may receive a codeword over a data channel. The codeword (e.g., the codeword 114) may be encoded with a first number of data bits. The first number may be not greater than a preset value associated with a Galois filed.

The syndrome calculation module 204 may determine a plurality of syndrome values for the codeword during a first time interval. In some embodiments, during the calculation of a syndrome value, the syndrome calculation module 204 may be able to process one bit in a cycle. In some embodiments, during the calculation of a syndrome value, the syndrome calculation module 204 may be able to process more than one bit in a cycle.

The error locator polynomial module 206 may generate an error locator polynomial based on the plurality of syndrome values determined by the syndrome calculation module 204. The error locator polynomial may represent one or more errors in the codeword.

The error location determination module 208 may determine a set of initial elements during the first time interval. The set of initial elements may be associated with the difference between the preset value and the first number. The error location determination module 208 may also evaluate, based on the set of initial elements, the error locator polynomial to identify one or more error locations corresponding to the one or more errors in the codeword.

The error correction module 210 may correct the codeword based on the one or more error locations. The error correction module 210 may correct the one or more errors in the corresponding one or more error locations.

In some embodiments, the BCH decoder 116 may further include a storage module (not shown in FIG. 2). The storage module may store data and/or information of other components of the BCH decoder 116 (e.g., the receiving module 202, the syndrome calculation module 204, the error locator polynomial module 206, or the error location determination module 208). Detailed descriptions of the BCH decoder 116 may be found elsewhere in the present disclosure (e.g., FIG. 3 and the descriptions thereof).

The components in the BCH decoder 116 may be connected to or communicate with each via a wired connection or a wireless connection. The wired connection may include a metal cable, an optical cable, a hybrid cable, or the like, or any combination thereof. The wireless connection may include a Local Area Network (LAN), a Wide Area Network (WAN), a Bluetooth™, a ZigBee™, a Near Field Communication (NFC), or the like, or any combination thereof.

Figure 3:
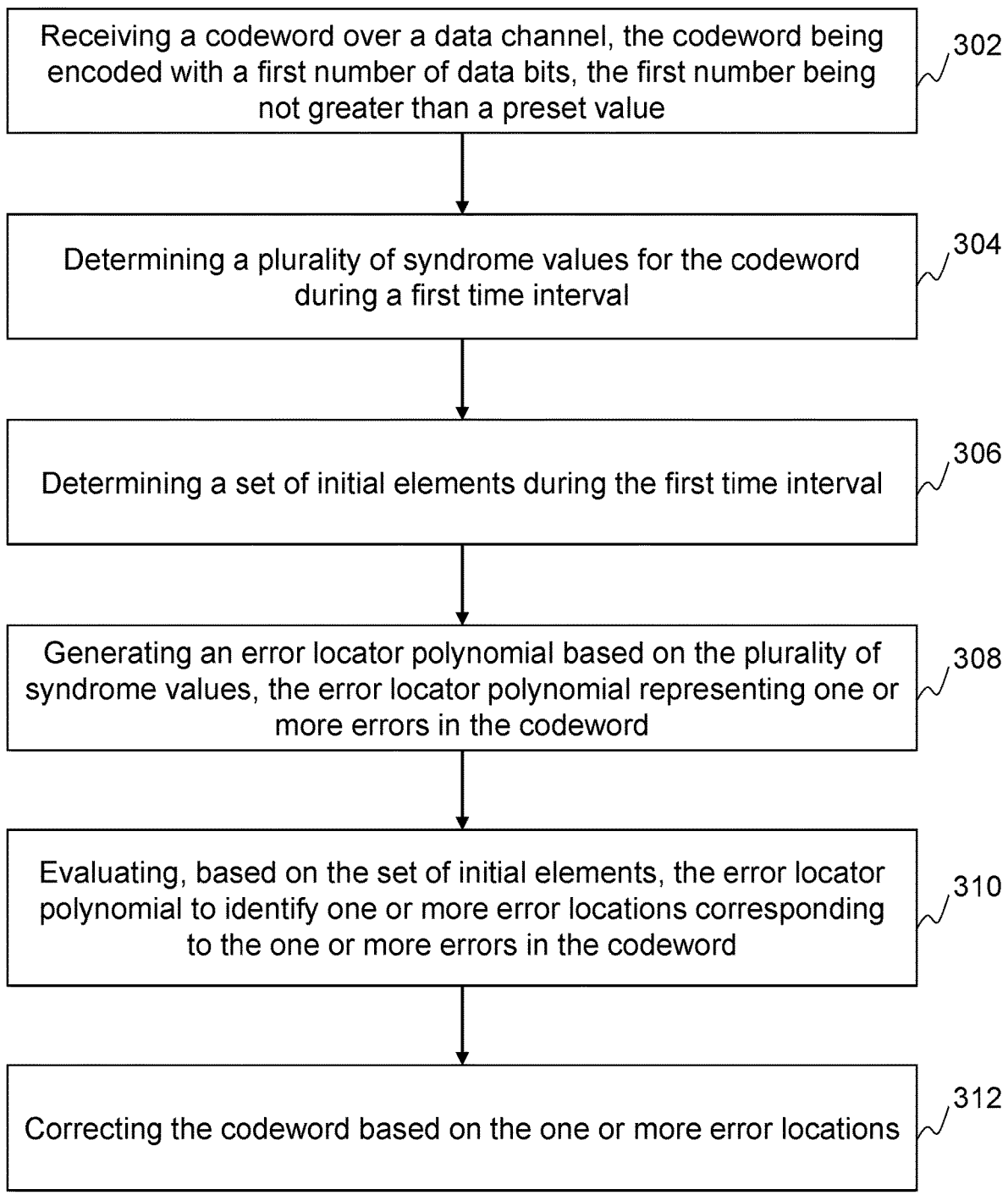
FIG. 3 is a flowchart illustrating an exemplary process for decoding a codeword according to some embodiments of the present disclosure.

FIG. 3 a flowchart illustrating an exemplary process 300 for decoding a codeword according to some embodiments of the present disclosure. The process 300 may be executed by the communication system 100. For example, the process 300 may be implemented by the BCH decoder 116.

In 302, the BCH decoder 116 (e.g., the receiving module 202) may receive a codeword over a data channel. The codeword (e.g., the codeword 114) may be encoded with a first number of data bits. The first number of data bits may include a preset number of user bits and a preset number of parity bits. The first number may be not greater than a preset value. The preset value may be associated with a Galois filed. For example, the codeword may be encoded by the BCH encoder 104 using an (n, k, t) binary BCH code over a Galois filed denoted by $GF(2^m)$. The codeword may be encoded with n data bits including k user bits and n−k parity bits. The first number may be n. The preset value of $GF(2^m)$ may be $2^m-1$. The first number n may be not greater than the preset value $2^m-1$, i.e., $2^m-1$. As disclosed in the present disclosure, the term "first number" and the parameter n may be used interchangeably to refer to the number of data bits of a codeword (e.g., codeword 114) received by the BCH decoder 116. The term "preset value" and the parameter $2^m-1$ may be used interchangeably to refer to the upper limit of the number of bits of $GF(2^m)$. In some embodiments, the first number n may be equal to the preset value $2^m-1$, i.e., $n=2^m-1$. The difference between the preset value $2^m-1$ and the first number n is equal to zero. In some embodiments, the first number n may be smaller than the preset value $2^m-1$, i.e., $n<2^m-1$. The difference between the preset value $2^m-1$ and the first number n may be referred to as a second number (i.e., $2^m-1-n$). Each of the second number of bits may be assigned with a specific value. For example, all the second number of bits may be assigned with zeros. Each of the $2^m-1$ bits of $GF(2^m)$ may correspond to a bit position, ranging from 0 to $2^m-1-1$. In the present disclosure, the bit in the bit position $2^m-1-1$ is called the most significant bit, and the bit in the bit position 0 is called the least significant bit. The second number of zero bits correspond to bit positions ranging from the bit position $2^m-1-1$ to the bit position n. The n data bits of the codeword correspond to bit positions ranging from the bit position n−1 to the bit position 0. In other words, the second number of zero bits may be the most significant bits of $GF(2^m)$ and may be padded on the left side the n data bits of the codeword. The data channel may include a wired communication channel (e.g., wires, fiber optic cables), a wireless channel, or a storage device (e.g., a magnetic disk, an optical disk, etc.), etc. In some embodiments, the data channel may be the channel 110. For example, the BCH decoder 116 may receive the codeword (e.g., the codeword 114) over the channel 110 after demodulation of the demodulator 112. In some embodiments, the codeword may include one or more potentially bit errors that are introduced by degradations and/or data corruption of the data channel. The BCH decoder 116 may decode the codeword and correct the bit errors in the codeword.

In 304, the BCH decoder 116 (e.g., the syndrome calculation module 204) may determine a plurality of syndrome values for the codeword during a first time interval. In some embodiments, the BCH decoder 116 may decode the codeword using the (n, k, t) binary BCH code employed by the BCH encoder 104. Accordingly, the plurality of syndrome values may include 2t syndrome values, where the parameter t represents the correction power of the (n, k, t) binary BCH code. The codeword may be represented as a polynomial. For example, the codeword may include n data bits $r_{n-1}, \ldots, r_2, r_1, r_0$ ($r_i \in \{0, 1\}$, i=0, 1, 2, ..., n-1). The polynomial corresponding to the codeword may be represented as $r(x) = r_0 + r_1 x + r_2 x^2 + \ldots + r_{n-1} x^{n-1}$. To calculate or determine the 2t syndrome values, the BCH decoder 116 may perform a modulo operation on the polynomial r(x). A syndrome value $S_j$ (j=1, 2, ..., or 2t) may correspond to the reminder of r(x) divided by a polynomial $\phi_j(x)$, where $\phi_j(x)$ is the minimal polynomial of $\alpha^j$ ($\alpha$ is the primitive element of $GF(2^m)$). The 2t syndrome values may be represented as $(S_1, S_2, \ldots, S_{2t})$. In some embodiments, a syndrome value $S_j$ (j=1, 2, ..., or 2t) may be described according to Equation (1):

$$S_j = r(\alpha^j) = r_o + r_1 \alpha^j + r_2 \alpha^{2j} + \ldots + r_{n-1} \alpha^{(n-1)j}, \quad (1)$$

where $r(\alpha^j)$ represents the syndrome value $S_j$ (j=1, 2, ..., or 2t), $\alpha$ represents the primitive element of $GF(2^m)$, and $r_i$ (i=0, 1, 2, ..., n-1) represents a data bit of the n-bit codeword.

In some embodiments, the BCH decoder 116 (e.g., the syndrome calculation module 204) may include 2t syndrome calculation units. Each syndrome calculation unit may determine one of the 2t syndrome values. During the first time interval, the 2t syndrome calculation units may determine the 2t syndrome values simultaneously. For example, during the calculation of a syndrome value, the corresponding syndrome calculation unit may be able to process p data bit(s) in a cycle, where p is an appropriate positive integer. The 2t syndrome value calculation units may need $$\left\lceil \frac{n}{p} \right\rceil$$

cycles to process the n data bits of the codeword to determine the 2t syndrome values simultaneously. The first time interval may correspond to $$\left\lceil \frac{n}{p} \right\rceil$$

cycles. As used herein, the $$\left\lceil \frac{n}{p} \right\rceil$$

cycles may also be referred to as σ cycles. In some embodiments, during the calculation of a syndrome value, the corresponding syndrome value calculation unit may be able to process one bit in a cycle, i.e., p=1. In some embodiments, during the calculation of a syndrome value, the corresponding syndrome value calculation unit may be able to process more than one data bit in a cycle, i.e., p>1. More descriptions of the determination of the 2t syndrome values may be found elsewhere in the present disclosure (e.g., FIGS. 4-6, and the descriptions thereof).

In some embodiments, the first number n may be smaller than the preset value $2^m - 1$. During the calculation of a syndrome value, the BCH decoder 116 may skip processing the second number of zero bits. The reason is that zero bits do not affect the result of the syndrome value (as illustrated in Equation (1)).

In some embodiments, at least one of the 2t syndrome values may not be equal to zero. The BCH decoder 116 may determine that the codeword is not a valid codeword and includes one or more errors. The BCH decoder 116 may identify locations corresponding to the one or more errors in the codeword, and correct the one or more errors based on the locations (as will be described in detail in the following descriptions).

In 306, the BCH decoder 116 (e.g., the error location determination module 208) may determine a set of initial elements during the first time interval. The set of initial elements may be associated with the difference between the preset value and the first number. In some embodiments, the first number n may be smaller than the preset value $2^m - 1$. As described in connection with operation 302, the difference between the preset value $2^m - 1$ and the first number n may be referred as a second number (i.e., $2^m - 1 - n$). The set of initial elements may be a set of values corresponding to the processing of the second number of zero bits of $GF(2^m)$. The set of initial elements may be used for identifying error locations corresponding to the first number of data bits during a second time interval. More descriptions of the set of initial elements may be found elsewhere in the present disclosure (e.g., operation 310, FIG. 7, FIG. 8 and the descriptions thereof).

In 308, the BCH decoder 116 (e.g., the error locator polynomial module 206) may generate an error locator polynomial based on the plurality of syndrome values. For example, the BCH decoder 116 may process the 2t syndrome values determined in operation 304 to generate the error locator polynomial. In some embodiments, the BCH decoder 116 may generate the error locator polynomial using an algorithm such as a Berlekamp-Massey algorithm, a Euclid algorithm, a Peterson-Gorenstein Zierler algorithm, etc. In some embodiments, the error locator polynomial may be described according to Equation (2):

$$\lambda(x) = \lambda_0 + \lambda_1 x + \lambda_2 x^2 + \ldots + \lambda_t x^t, \quad (2)$$

where $\lambda(x)$ represents the error locator polynomial, and $\lambda_0, \lambda_1, \lambda_2, \ldots, \lambda_t$ represent the coefficients of the error locator polynomial $\lambda(x)$.

The error locator polynomial $\lambda(x)$ may represent one or more errors in the codeword. The roots of the error locator polynomial may indicate one or more error locations corresponding to the one or more errors in the codeword. For example, if $\lambda(\alpha^i)$ (i=1, 2, ..., n) is equal to zero, $\alpha^i$ may be determined as a root of the error locator polynomial $\lambda(x)$. The root $\alpha^i$ may indicate that an error is present in bit position n−i of the codeword. More descriptions of the error locator polynomial may be found elsewhere in the present disclosure (e.g., FIG. 7 and the descriptions thereof).

In 310, the BCH decoder 116 (e.g., the error location determination module 208) may evaluate, based on the set of initial elements, the error locator polynomial to identify one or more error locations corresponding to the one or more errors in the codeword. The BCH decoder 116 may receive the error locator polynomial $\lambda(x)$ (or the coefficients of the error locator polynomial $\lambda(x)$) from the error locator polynomial module 206. In some embodiments, to identify the one or more error locations corresponding to the one or more errors in the codeword, the BCH decoder 116 may use a Chien search algorithm to determine a value $\lambda(\alpha^i)$ (i=1, 2, ..., n) of the error locator polynomial $\lambda(x)$ for all the n data bits. The BCH decoder 116 may evaluate the error locator polynomial by determining whether $\lambda(\alpha^i)$ is equal to zero. If $\lambda(\alpha^i)$ is equal to zero, the BCH decoder 116 may determine that $\alpha^i$ is a root of the error locator polynomial $\lambda(x)$. The BCH decoder 116 may then identify that the bit in bit position n−i is an erroneous bit. If $\lambda(\alpha^i)$ is not equal to zero, the BCH decoder 116 may determine that $\alpha^i$ is not a root of the error locator polynomial $\lambda(x)$. The BCH decoder 116 may then determine that an error is not detected in bit position n−i.

In some embodiments, the first number n may be equal to the preset value $2^m-1$, i.e., $n=2^m-1$. During the evaluation of the error locator polynomial, the BCH decoder 116 may process the n data bits from the most significant bit $r_{n-1}$ down to the least significant bit $r_0$. Accordingly, the index i runs from 1 to n when substituting $\alpha^i$ into the error locator polynomial $\lambda(x)$. A value $\lambda(\alpha^{i+1})$ of the error locator polynomial $\lambda(x)$ may correspond to a bit in bit position n−i−1. A value $\lambda(\alpha^i)$ of the error locator polynomial $\lambda(x)$ may correspond to a bit in bit position n−i. As illustrated in Equation (2), the error locator polynomial $\lambda(x)$ includes t+1 terms, i.e., a coefficient $\lambda_0$ and t product terms $\lambda_1 x, \lambda_2 x^2, \ldots, \lambda_t x^t$. The value $\lambda(\alpha^{i+1})$ may be generated by multiplying the $j^{th}$ (j=1, 2, ..., t) product term of $\lambda(\alpha^i)$ by $\alpha^j$ for all j and summing all terms again. For example, $\lambda(\alpha^i)$ may be described as $\lambda(\alpha^i)=\lambda_0+\lambda_1\alpha_i+\lambda_2\alpha^{2i}+ \ldots +\lambda_t\alpha^{ti}$. $\lambda(\alpha^i)$ may include t+1 terms, i.e., the coefficient $\lambda_0$ and t product terms $\lambda_1\alpha^i, \lambda_2\alpha^{2i}, \ldots, \lambda_t\alpha^{ti}$. When calculating $\lambda(\alpha^{i+1})$, each of the t product terms $\lambda_1\alpha^i, \lambda_2\alpha^{2i}, \ldots, \lambda_t\alpha^{ti}$ may be multiplied by a corresponding power of $\alpha$, i.e., $\alpha^1, \alpha^2, \ldots, \alpha^t$. As a result, t new product terms $\lambda_1\alpha^i*\alpha, \lambda_2\alpha^{2i}*\alpha^2, \ldots, \lambda_t\alpha^{ti}*\alpha^t$ may be obtained. $\lambda(\alpha^{i+1})$ is equal to the summation of the t new product terms $\lambda_1\alpha^i*\alpha, \lambda_2\alpha^{2i}*\alpha^2, \ldots, \lambda_t\alpha^{ti}*\alpha^t$ and the coefficient $\lambda_0$. Therefore, $\lambda(\alpha^{i+1})$ may be described as $\lambda(\alpha^{i+1})=\lambda_0+\lambda_1\alpha^i*\alpha+\lambda_2\alpha^{2i}*\alpha^2+ \ldots +\lambda_t\alpha^{ti}*\alpha^t$ Since the coefficient $\lambda_j$ (j=1, 2, ..., t) may not be equal to zero, when calculating $\lambda(\alpha^{i+1})$, the corresponding powers of $\alpha$ (i.e., $\alpha^i, \alpha^{2i}, \ldots, \alpha^{ti}$) obtained when calculating $\lambda(\alpha^i)$ are needed. Therefore, to calculate or determine a corresponding value of the error locator polynomial $\lambda(x)$ for a bit in bit position n−i, the BCH decoder 116 may need the corresponding powers of $\alpha$ obtained when calculating a corresponding value of the error locator polynomial $\lambda(x)$ for a bit in bit position n−i+1.

In some embodiments, the first number n may be smaller than the preset value $2^m-1$, i.e., $n<2^m-1$. As described in operation 302, the second number (i.e., $2^m-1-n$) of zero bits correspond to bit positions ranging from the bit position $2^m-1-1$ to the bit position n. When determining corresponding values of the error locator polynomial for the n data bits ranging from the bit position n−1 to the bit position 0, the BCH decoder 116 may need the corresponding powers of $\alpha$ associated with the second number of zero bits. The corresponding powers of $\alpha$ associated with the second number of zero bits may be referred to as the set of initial elements. Each of the set of initial elements may be related to repeated multiplication of a corresponding power of $\alpha$. The times of the repeated multiplication may be associated with the second number (or the difference between the preset value and the first number) $2^m-1-n$.

In some embodiments, to determine or obtain the set of initial elements, the BCH decoder 116 may process the second number of zero bits during the evaluation of the error locator polynomial. Assuming that the BCH decoder 116 may be able to process p bit(s) in a cycle, the BCH decoder 116 may need $\rho$ cycles to process the second number of zero bits, where $$\rho = \left\lceil \frac{2^m - 1 - n}{p} \right\rceil.$$

In some embodiments, the set of initial elements associated with the second number of zero bits may be described as Equation (3):

$$\lambda'_j = \alpha^{(pj)*\rho}, j=1,2,\ldots,t, \quad (3)$$

where $\lambda'_j$ represents an initial element, the set of initial elements includes t initial elements, p represents the number of bits that the BCH decoder 116 process in a cycle during the evaluation of the error locator polynomial, and p also represents the number of bits that the BCH decoder 116 process in a cycle during the calculation of a syndrome value, and $\rho$ represents the number of cycles that the BCH decoder 116 need to process the second number of zero bits during the evaluation of the error locator polynomial. According to Equation (3), the BCH decoder 116 may determine the set of initial elements by calculating repeated multiplication of $\alpha^{pj}$ for $\rho$ cycles.

When obtaining the set of initial elements by implementing the process described in the above paragraph, $\rho$ cycles are consumed before evaluating the error locator polynomial for the n data bits of the codeword and thus, causing latency or delay in the stage of the evaluation of the error locator polynomial.

To save latency in the stage of the evaluation of the error locator polynomial, the BCH decoder 116 may skip processing the second number of zero bits during the evaluation of the error locator polynomial in operation 310. Instead, the BCH decoder 116 may determine the set of initial elements during the first time interval (as disclosed in operation 306). The BCH decoder 116 may also determine the 2t syndrome values during the first time interval. According to Equation (3), the determination of the set of initial elements may need $\rho$ cycles, where $\rho$ is equal to $$\left\lceil \frac{2^m - 1 - n}{p} \right\rceil.$$

The determination of the 2t syndrome values may need $\sigma$ cycles, where $\sigma$ is equal to $$\left\lceil \frac{n}{p} \right\rceil.$$

When $n<(2^m-1)/2$, $\rho$ is greater than $\sigma$. When $\rho$ is greater than $\sigma$, the BCH decoder 116 needs to obtain the set of initial elements $\lambda'_j = \alpha^{(pj)*\rho}$ (j=1, 2, ..., t) within the $\sigma$ cycles. The BCH decoder 116 may obtain the set of initial elements within the $\sigma$ cycles based on the following Equations (4)-(9):

$$\lambda'_j = \alpha^{(pj)*\rho} = \alpha^{j*(2^m-1-n)} = \alpha^{(2^m-1)*j} * \alpha^{-jn}, \quad (4)$$

$$\alpha^{2^m-1}=1, \quad (5)$$

$$\lambda'_j = \alpha^{-jn}, j=1,2,\ldots,t, \quad (6)$$

$$\alpha^{pj\sigma} = \sigma\alpha^{jn}, \quad (7)$$

$$\alpha^{-pj\sigma} = \sigma\alpha^{-jn} = \lambda'_j, \quad (8)$$

$$\lambda'_j = \alpha^{-pj\sigma}, \quad (9)$$

Equation (6) may be obtained based on Equation (4) and Equation (5). Equation (8) may be obtained based on Equation (7). Equation (9) may be obtained based on Equation (6) and Equation (8). Equation (9) shows that the set of initial elements may also be described as $\lambda'_j = \alpha^{-pj\sigma}$ (j=1, 2, . . . , t), which indicates that the set of initial elements may be derived by the repeated multiplication of $\alpha^{(-pj)}$ for σ cycles. In the case that ρ is greater than σ, the BCH decoder 116 may still be able to obtain the set of initial elements within the σ cycles. Therefore the BCH decoder 116 may achieve determining the set of initial elements during the first time interval. Thus, the BCH decoder 116 may save latency (p cycles) in the stage of evaluating the error locator polynomial.

More descriptions of the set of initial elements and the evaluation of the error locator polynomial may be found elsewhere in the present disclosure (e.g., FIGS. 7-12 and the descriptions thereof).

In 312, the BCH decoder 116 (e.g., the error correction module 210) may correct the codeword based on the one or more error locations. The BCH decoder 116 may correct the one or more errors in the corresponding one or more error locations. For example, in binary BCH coding, the BCH decoder 116 may correct the one or more errors by performing bit flipping operations on the one or more errors. The BCH decoder 116 may switch an erroneous bit from 0 to 1, or vice versa. In some embodiments, when the number of the one or more errors is not greater than the correction power (i.e., t) of the (n, k, t) binary BCH code employed by the BCH decoder 116, the BCH decoder 116 may be able to correct all errors in the codeword. In some embodiments, when the number of the one or more errors is greater than the correction power of the (n, k, t) binary BCH code employed by the BCH decoder 116, the BCH decoder 116 may not be able to correct all errors in the codeword. In some embodiments, the BCH decoder 116 may output a signal indicating that the correcting process is not successfully completed.

It should be noted that above description is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure. For example, the process 300 may include a storing operation for storing the codeword, the plurality of syndrome values, the error locator polynomial, and/or the error locations during the decoding of the codeword.

Figure 4:
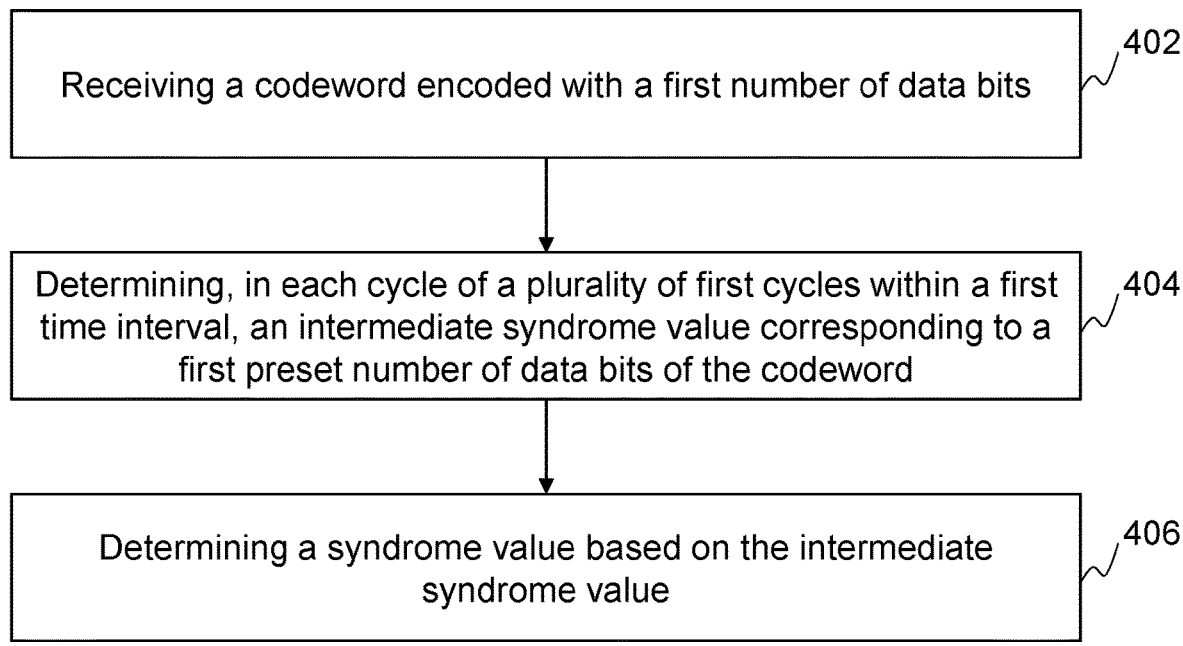
FIG. 4 is a flowchart illustrating an exemplary process for determining a plurality of syndrome values according to some embodiments of the present disclosure.

FIG. 4 is a flowchart illustrating an exemplary process 400 for determining a plurality of syndrome values according to some embodiments of the present disclosure. The process 400 may be executed by the communication system 100. For example, the process 400 may be implemented by the BCH decoder 116. In some embodiments, operation 304 of the process 300 in FIG. 3 may be implemented by performing one or more operations in the process 400.

In 402, the BCH decoder 116 (e.g., the syndrome calculation module 204) may receive a codeword encoded with a first number of data bits. The first number of data bits may include a preset number of user bits and a preset number of parity bits. The first number may be not greater than a preset value. The preset value may be associated with a Galois filed. For example, the codeword may be encoded by the BCH encoder 104 using an (n, k, t) binary BCH code over a Galois filed denoted by $GF(2^m)$. The codeword may be encoded with n data bits including k user bits and n-k parity bits. The first number may be n. The preset value of $GF(2^m)$ may be $2^m-1$. The first number n may be not greater than the preset value $2^m-1$, i.e., $n \leq 2^m-1$. More descriptions of the first number and the preset value may be found elsewhere of the present disclosure (e.g., FIG. 3 and the descriptions thereof). The codeword may be represented as a polynomial. For example, the codeword may include n bits ($r_{n-1}$, . . . , $r_2$, $r_1$, $r_0$) ($r_i \in \{0, 1\}$, =0, 1, 2, . . . , n-1). The polynomial corresponding to the codeword may be represented as $r(x) = r_0 + r_1 x + r_2 x^2 + \ldots + r_{n-1} x^{n-1}$. In some embodiments, the syndrome calculation module 204 may receive the codeword from the receiving module 202. In some embodiments, the syndrome calculation module 204 may receive the codeword from a storage module (not shown) of the BCH decoder 116 or the communication system 100.

In 404, the BCH decoder 116 (e.g., the syndrome calculation module 204) may determine, in each cycle of a plurality of first cycles within a first time interval, an intermediate syndrome value corresponding to a first preset number of data bits of the codeword. An intermediate syndrome value may be an intermediate value (or a portion) of a syndrome value $S_j$ (j=1, 2, . . . , 2t) of the polynomial r(x). During the calculation of a syndrome value, the BCH decoder 116 may process the first preset number of data bits in a cycle to determine the intermediate syndrome value of the syndrome value. Corresponding to the description in operation 304, the first preset number may be denoted by p. The BCH decoder 116 may need σ

$$\left(\sigma = \left\lceil \frac{n}{p} \right\rceil\right)$$

cycles to process the n data bits of the codeword to determine or produce the syndrome value. Therefore, the plurality of first cycles may correspond to the σ cycles.

In 406, the BCH decoder 116 (e.g., the syndrome calculation module 204) may determine a syndrome value based on the intermediate syndrome value. In each cycle of the σ cycles, the intermediate syndrome value may be updated. The intermediate syndrome value updated in the last cycle of the σ cycles may be determined as the syndrome value.

Figure 5:
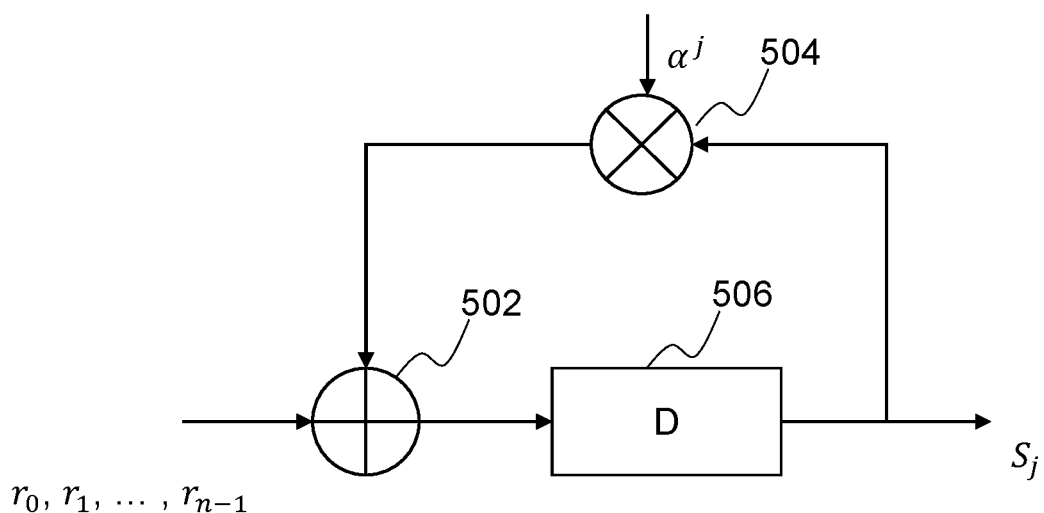
FIG. 5 is a schematic diagram illustrating an exemplary syndrome calculation unit according to some embodiments of the present disclosure.

In some embodiments, during the calculation of a syndrome value, the BCH decoder 116 may be able to process one bit in a cycle, i.e., p=1. For example, FIG. 5 is a schematic diagram illustrating an exemplary syndrome calculation unit 500 according to some embodiments of the present disclosure. The syndrome calculation unit 500 may determine a syndrome value $S_j$ (j=1, 2, . . . , or 2t). During the calculation of the syndrome value $S_j$, the syndrome calculation unit 500 may be able to process one data bit in a cycle, i.e., p=1. The syndrome calculation unit 500 may need n cycles to determine the syndrome value $S_j$. The syndrome calculation module 204 may include a plurality of syndrome calculation units 500. For example, the syndrome calculation module 204 may include 2t syndrome calculation units 500 to determine 2t syndrome values simultaneously. Each syndrome calculation unit 500 may determine one of the 2t syndrome values.

As shown in FIG. 5, the syndrome calculation unit 500 may include an adder 502, a multiplier 504, and a register 506. The multiplier 504 may multiply the value of the register 506 with a corresponding power of the primitive element α of $GF(2^m)$ (i.e., $\alpha^j$, j=1, 2, . . . , 2t illustrated in FIG. 5) to produce a product. The product may be added with the input of the adder 502 to output a summation, which may be stored in the register 506. The input of the adder 502 may be a coefficient of the polynomial $r(x)_7$ i.e., a data bit of the codeword. The output of the adder 502 or the value of the register 506 may be referred to as an intermediate syndrome value of the syndrome value $S_j$. In each cycle, the adder 502 may receive a coefficient of the polynomial r(x) from, for example, the receiving module 202. Firstly, the coefficient is received. For example, during the calculation of the syndrome value $S_j$, in the first cycle, the adder 502 may receive the coefficient $r_{n-1}$, which may be output to and stored in the register 506. The intermediate syndrome value may be the coefficient $r_{n-1}$ in the first cycle. The multiplier 504 may multiply the coefficient $r_{n-1}$ with $\alpha^j$ to produce a product $r_{n-1}\alpha^j$. In the second cycle, the adder 502 may receive a coefficient $r_{n-2}$. The adder 502 may add the coefficient $r_{n-2}$ with the product $r_{n-1}\alpha^j$ to produce a summation $r_{n-1}\alpha^j+r_{n-2}$ which may be output to the register 506. The intermediate syndrome value stored in the register 506 may be updated to be $r_{n-1}\alpha^j+r_{n-2}$ in the second cycle. The multiplier 504 may multiply the summation with $r_{n-1}\alpha^j+r_{n-2}$ to produce a product $(r_{n-1}\alpha^j+r_{n-2})\alpha^j$, which may be used in the third cycle. The intermediate syndrome value may be updated in each cycle. Similarly, in the $n^{th}$ cycle (i.e., the last cycle), the adder 502 may receive a coefficient $r_0$. The intermediate syndrome value obtained in the $(n-1)^{th}$ cycle may be updated to be a summation ( . . . $((r_{n-1}\alpha^j+r_{n-2})\alpha^j+r_{n-3})\alpha^j+ \ldots +r_1)\alpha^j+r_0$ in the $n^{th}$ cycle. The syndrome calculation unit 500 may determine the intermediate syndrome value ( . . . $((r_{n-1}\alpha^j+r_{n-2})\alpha^j+r_{n-3})\alpha^j+ \ldots +r_1)\alpha^j+r_0$ obtained in the $n^{th}$ cycle as the syndrome value $S_j$.

According to the calculation process described above, the syndrome value $S_j$ may also be described according to Equation (10):

$$S_j=r(\alpha^j)=( \ldots ((r_{n-1}\alpha^j+r_{n-2})\alpha^j+r_{n-3})\alpha^j+ \ldots +r_1)\alpha^j+r_0, j=1,2, \ldots, \text{or } 2t, \quad (10)$$

For the same j, the value of Equation (10) is mathematically equal to the value of Equation (1).

Figure 6:
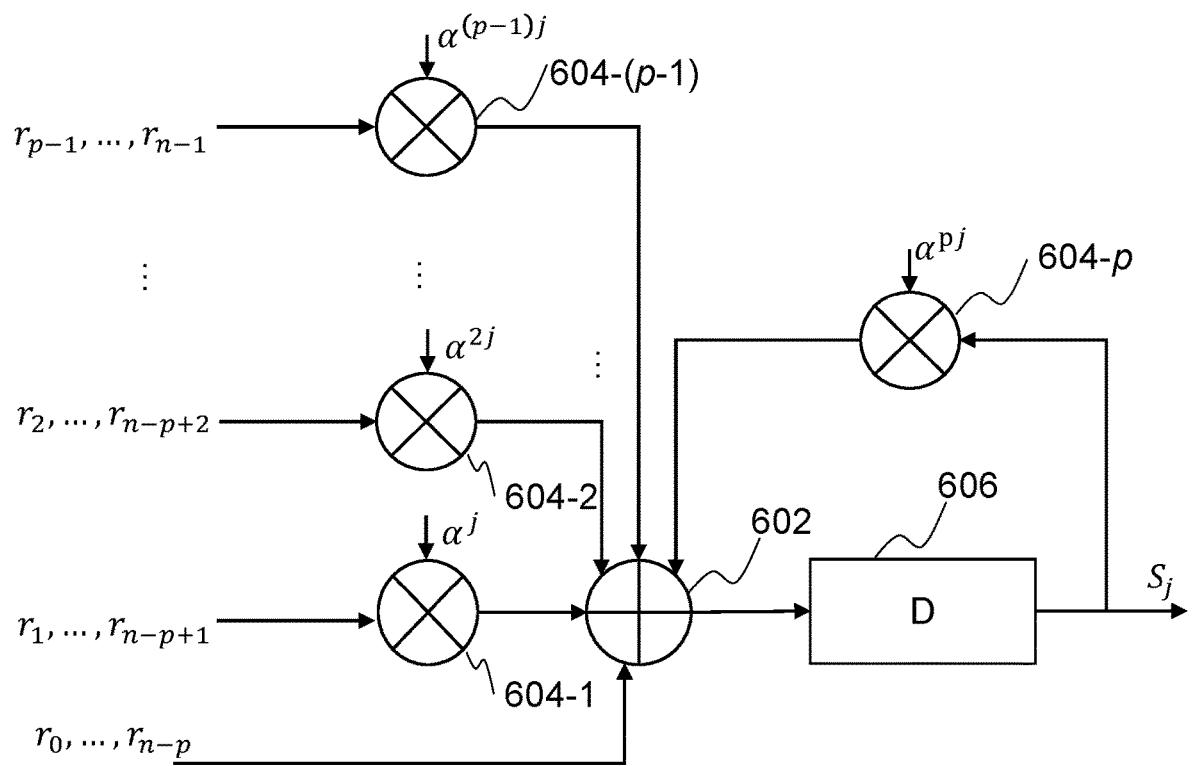
FIG. 6 is a schematic diagram illustrating an exemplary syndrome calculation unit according to some embodiments of the present disclosure.

In some embodiments, during the calculation of a syndrome value, the BCH decoder 116 may be able to process more than one data bit in a cycle, i.e., p>1. For example, FIG. 6 is a schematic diagram illustrating an exemplary syndrome calculation unit 600 according to some embodiments of the present disclosure. The syndrome calculation unit 600 may determine a syndrome value $S_j$ (j=1, 2, . . . , or 2t). During the calculation of the syndrome value $S_j$, the syndrome calculation unit 600 may be able to process p bits (p>1) in a cycle. The syndrome calculation unit 600 may need $$\left\lceil \frac{n}{p} \right\rceil$$

cycles to determine the syndrome value $S_j$. The syndrome calculation module 204 may include a plurality of syndrome calculation units 600. For example, the syndrome calculation module 204 may include 2t syndrome calculation units 600 to determine 2t syndrome values simultaneously. Each syndrome calculation unit 600 may determine one of the 2t syndrome values.

As shown in FIG. 6, the syndrome calculation unit 600 may include an adder 602, a register 606, and p multipliers. The p multipliers may include multiplier 604-1, multiplier 604-2, . . . , multiplier 604-(p−1), and multiplier 604-p. The multiplier 604-p may multiply the value of the register 606 with a corresponding power of the primitive element α of the GF($2^m$) (i.e., $\alpha^{pj}$, j=1, 2, . . . , 2t illustrated in FIG. 6) to produce a product. The product may be added with the inputs of the adder 602 to output a summation, which may be stored in the register 606. The inputs of the adder 602 may include the product of the multiplier 604-1, the product of the multiplier 604-2, . . . , the product of the multiplier 604-(p−1), and coefficients of the polynomial r(x). The output of the adder 602 or the value of the register 606 may be referred to as an intermediate syndrome value of the syndrome value $S_j$. In each cycle, each of the multipliers 604-1, 604-2, . . . , 604-(p−1) and the adder 602 may respectively receive a coefficient of the polynomial r(x) from, for example, the receiving module 202. Firstly, the coefficients $r_{n-1}, r_{n-2}, r_{n-p}$ are received. Each of the multipliers 604-1, 604-2, . . . , 604-(p−1) may multiply its input coefficient with a corresponding power of the primitive element α of the GF($2^m$) (i.e., $\alpha^j, \alpha^{2j}, \ldots, \alpha^{(p-1)j}$ illustrated in FIG. 6) to produce (p−1) products. For example, during the calculation of the syndrome value $S_j$, in the first cycle, the multiplier 604-(p−1) may receive a coefficient $r_{n-1}, \ldots$, the multiplier 604-2 may receive a coefficient $r_{n-p+2}$, the multiplier 604-1 may receive a coefficient $r_{n-p+1}$, and the adder 602 may receive a coefficient $r_{n-p}$. The multiplier 604-(p−1) may multiply the coefficient $r_{n-1}$ with $\alpha^{(p-1)j}$ to produce a product $r_{n-1}\alpha^{(p-1)j}, \ldots$, the multiplier 604-2 may multiply the coefficient $r_{n-p+2}$ with $\alpha^{2j}$ to produce a product $r_{n-p+2}\alpha^{2j}$, and the multiplier 604-1 may multiply the $r_{n-p+1}$ with $\alpha^j$ to produce a product $r_{n-p+1}\alpha^j$. The adder 602 may add the (p−1) products with the coefficient $r_{n-p}$ to produce a summation $r_{n-1}\alpha^{(p-1)j}+ \ldots +r_{n-p+2}\alpha^{2j}+r_{n-p+1}\alpha^j+r_{n-p}$, which may be output to and stored in the register 606. The intermediate syndrome value may be the summation $r_{n-1}\alpha^{(p-1)j}+ \ldots +r_{n-p+2}\alpha^{2j}+r_{n-p+1}\alpha^j+r_{n-p}$ in the first cycle. The multiplier 604-p may multiply the summation $r_{n-1}\alpha^{(p-1)j}+ \ldots +r_{n-p+2}\alpha^{2j}+r_{n-p+1}\alpha^j+r_{n-p}$ a $r_{n-p}$ with $\alpha^{pj}$ to produce a product $(r_{n-1}\alpha^{(p-1)j}+ \ldots +r_{n-p+2}\alpha^{2j}+r_{n-p+1}\alpha^j+r_{n-p})\alpha^{pj}$. In the second cycle, the multiplier 604-(p−1) may receive a coefficient $r_{n-p-1} \ldots$, the multiplier 604-2 may receive a coefficient $r_{n-2p+2}$ and the multiplier 604-1 may receive a coefficient $r_{n-2p+1}$. The adder 602 may receive a coefficient $r_{n-2p}$. The multiplier 604-(p−1) may multiply the coefficient $r_{n-p-1}$ with $\alpha^{(p-1)j}$ to produce a product $r_{n-p-1}\alpha^{(p-1)j}, \ldots$, the multiplier 604-2 may multiply the coefficient $r_{n-2p+2}$ with $\alpha^{2j}$ to produce a product $r_{n-2p+2}\alpha^{2j}$, and the multiplier 604-1 may multiply the $r_{n-2p+1}$ with $\alpha^j$ to produce a product $r_{n-2p+2}\alpha^j$. The adder 602 may add the product $(r_{n-1}\alpha^{(p-1)j}+ \ldots +r_{n-p+2}\alpha^{2j}+r_{n-p+1}\alpha^j+r_{n-p})\alpha^{pj}$ produced in the first cycle with the (p−1) products $r_{n-p-1}\alpha^{(p-1)j}, \ldots, r_{n-2p+2}\alpha^{2j}, r_{n-2p+1}\alpha^j$, and the coefficient $r_{n-2p}$ to generate a summation $(r_{n-1}\alpha^{(p-1)j}+ \ldots +r_{n-p+2}\alpha^{2j}+r_{n-p+1}\alpha^j+r_{n-p})\alpha^{pj}+ \ldots +r_{n-2n+2}\alpha^{2j}+r_{n-2p+1}\alpha^j+r_{n-2p})$ which may be output to the register 606. The intermediate syndrome value stored in the register 606 may be updated to be the summation $((r_{n-1}\alpha^{(p-1)j}+ \ldots +r_{n-p+2}\alpha^{2j}+r_{n-p+1}\alpha^j+r_{n-p})\alpha^{pj}+ \ldots +r_{n-2n+2}\alpha^{2j}+r_{n-2p+1}\alpha^j+r_{n-2p})$. The multiplier 604-p may multiply the summation $((r_{n-1}\alpha^{(p-1)j}+ \ldots +r_{n-p+2}\alpha^{2j}+r_{n-p+1}\alpha^j+r_{n-p})\alpha^{pj}+ \ldots +r_{n-2n+2}\alpha^{2j}+r_{n-2p+1}\alpha^j+r_{n-2p})$ with $\alpha^{pj}$ to produce a product $((r_{n-1}\alpha^{(p-1)j}+ \ldots +r_{n-p+2}\alpha^{2j}+r_{n-p+1}\alpha^j+r_{n-p})\alpha^{pj}+ \ldots +r_{n-2n+2}\alpha^{2j}+r_{n-2p+1}\alpha^j+r_{n-2p})$, which may be used in the third cycle. The intermediate syndrome value may be updated in each cycle. The intermediate syndrome value obtained in the $$\left(\left\lceil \frac{n}{p} \right\rceil\right)^{th}$$

cycle (i.e., the last cycle) may be determined as the syndrome value $S_j$. According to the calculation process described above, the syndrome value $S_j$ (j=1, 2, . . . , or 2t) may also be described according to Equation (11):

$$S_j = r(\alpha^j) = ( \ldots (((r_{n-1}\alpha^{(p-1)j} + \ldots + r_{n-p+2}\alpha^{2j} + r_{n-p+1}\alpha^j + r_{n-p})\alpha^{pj} + r_{n-p-1}\alpha^{(p-1)j} + \ldots + r_{n-2p+2}\alpha^{2j} + r_{n-2p+1}\alpha^j + r_{n-2p})\alpha^{pj} + \ldots + r_{2p-1}\alpha^{(p-1)j} + \ldots + r_{p+2}\alpha^{2j} + r_{p+1}\alpha^j + r_p)\alpha^{pj} + r_{p-1}\alpha^{(p-1)j} + \ldots + r_2\alpha^{2j} + r_1\alpha^j + r_0, \quad (11)$$

For the same j, the value of Equation (11) is mathematically equal to the value of Equation (1) or the value of Equation (10).

The BCH decoder 116 may perform operations 404 and 406 by the syndrome calculation unit 500 or the syndrome calculation unit 600. The BCH decoder 116 may include 2t syndrome calculation units 500 or 2t syndrome calculation units 600 to determine 2t syndrome values for the n-bit codeword in a $$\left(\sigma = \left\lceil \frac{n}{p} \right\rceil\right)$$

cycles. In some embodiments, the first number n may be smaller than the preset value $2^m-1$ of $GF(2^m)$. The second number (i.e., the difference between the preset value and the first number) of bits may be assigned with zeros. During the calculation of the syndrome value, the BCH decoder 116 may skip processing the second number of zero bits. The reason is that the second number of zero bits do not affect the result of the syndrome value (as illustrated in Equation (1), Equation (10), or Equation (11)).

It should be noted that above description is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure. For example, the process 400 may include a storing operation for storing the codeword, the intermediate syndrome value, and/or the syndrome value during the decoding of the codeword.

Figure 7:
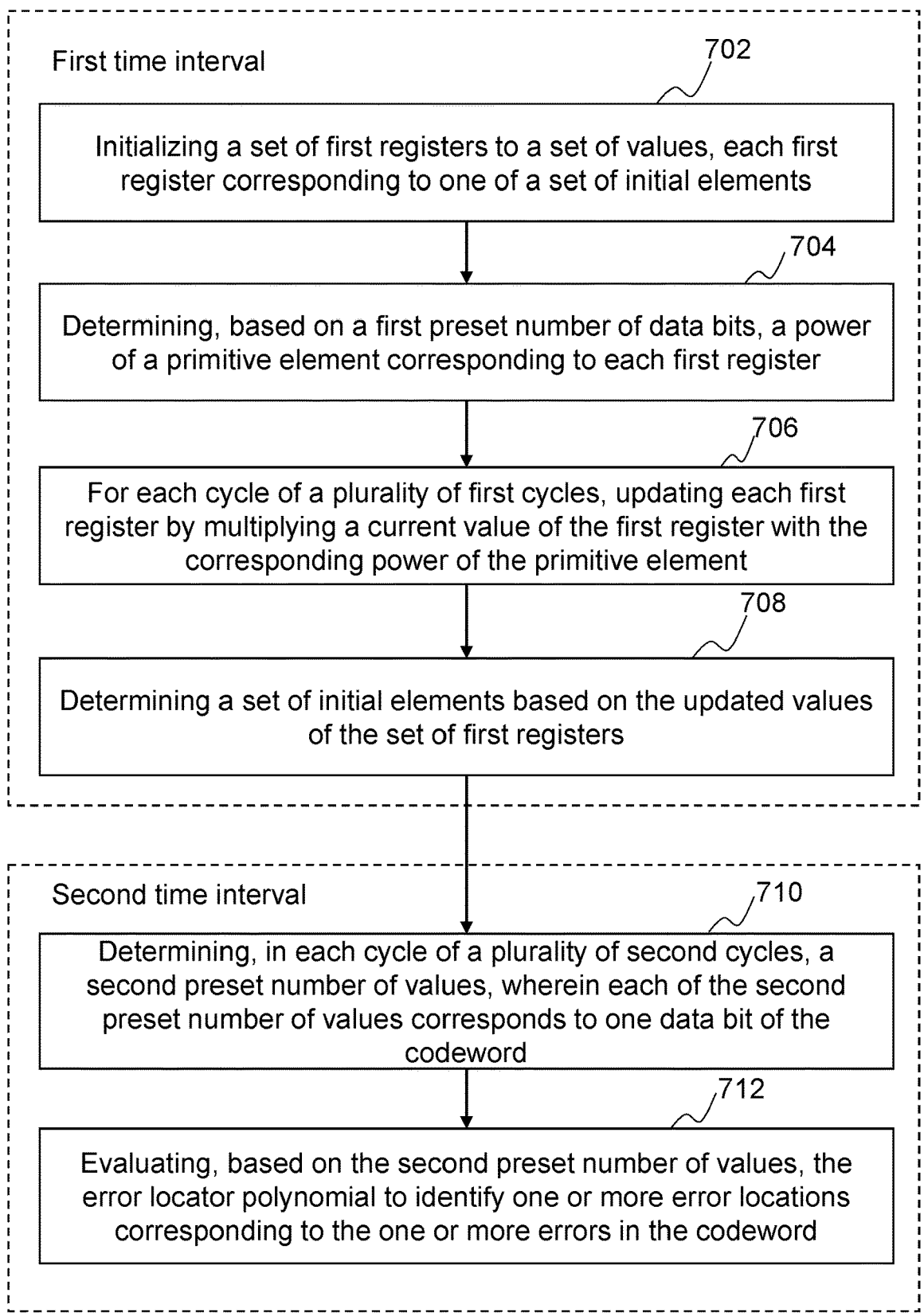
FIG. 7 is a flowchart illustrating an exemplary process for decoding a codeword according to some embodiments of the present disclosure.

FIG. 7 is a flowchart illustrating an exemplary process 700 for decoding a codeword according to some embodiments of the present disclosure. The process 700 may be executed by the communication system 100. For example, the process 700 may be implemented by the BCH decoder 116.

As illustrated in FIG. 7, the process 700 may be sequentially executed during a first time interval and a second time interval. During the first time interval, the BCH decoder 116 may perform operations 702-708 to determine a set of initial elements. As described in connection with operations 304 and 306 of the process 300 in FIG. 3, during the first time interval, the BCH decoder 116 may determine 2t syndrome values for an n-bit codeword, and concurrently, the BCH decoder 116 may determine the set of initial elements. In some embodiments, the first number n of the codeword may be smaller than the preset value $2^m-1$ of $GF(2^m)$. The set of initial elements may be a set of values corresponding to the process of a second number (also referred to as the difference between the preset value $2^m-1$ and the first number n) of zero bits in $GF(2^m)$. The set of initial elements may be used for identifying error locations corresponding to the first number of data bits in the second time interval. In some embodiments, operation 306 of the process 300 may be implemented by performing operations 702-708 in the process 700.

In 702, the BCH decoder 116 (e.g., the error location determination module 208) may initialize a set of first registers to a set of values. Each first register may correspond to one of the set of initial elements. In the present disclosure, the set of initial elements may include t initial elements described as $\lambda'_j = \alpha^{-pjo}$, j=1, 2, . . . , t. p represents the number of bits that the BCH decoder 116 process in a cycle during the evaluation of the error locator polynomial, and p also represents the number of bits that the BCH decoder 116 process in a cycle during the calculation of a syndrome value. σ

$$\left(\sigma = \left\lceil \frac{n}{p} \right\rceil\right)$$

represents the number of cycles the BCH decoder 116 needs for determining the 2t syndrome values. t represents the correction power of the BCH code employed by the BCH decoder 116. The set of first registers may include t registers.

Figure 8:
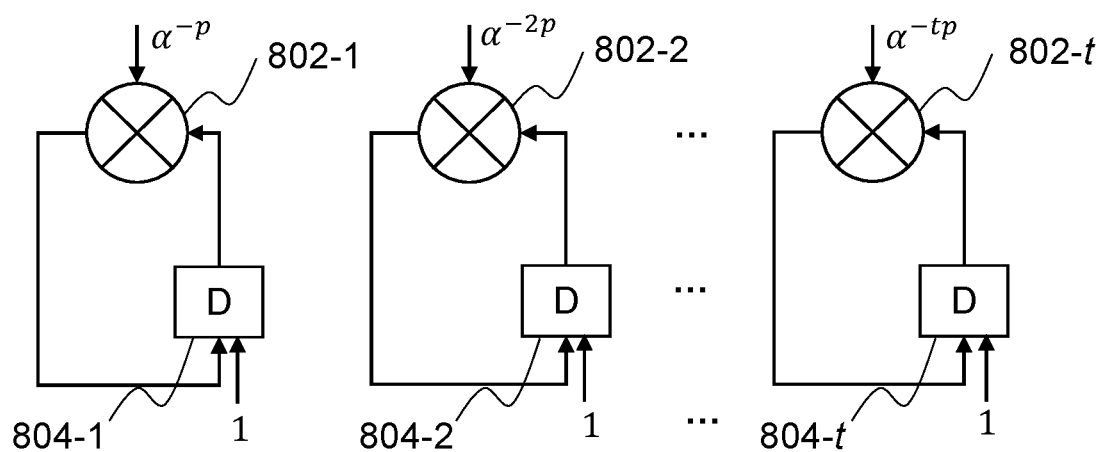
FIG. 8 is a schematic diagram illustrating an exemplary circuit according to some embodiments of the present disclosure.

For example, FIG. 8 a schematic diagram illustrating an exemplary circuit 800 according to some embodiments of the present disclosure. The circuit 800 may determine the t initial elements. The circuit 800 may be a part of BCH decoder 116. For example, the error location determination module 208 may include the circuit 800. As shown in FIG. 8, the circuit 800 may include t registers and t multipliers. The t registers may be t exemplary first registers. The t registers may include register 804-1, register 804-2, . . . , register 804-t. The t multipliers may include multiplier 802-1, multiplier 802-2, . . . , multiplier 802-t. Each of the t registers and each of the t multipliers may respectively correspond to one of the t initial elements.

To determine the t initial elements, the BCH decoder 116 may initialize the t registers to t ones. Each of the t registers may be assigned with one.

In 704, the BCH decoder 116 (e.g., the error location determination module 208) may determine, based on a first preset number of data bits, a power of a primitive element corresponding to each first register. According to the expression of an initial element, the power of the primitive element corresponding to each first register may be $\alpha^{-pj}$ (j=1, 2, . . . , t). The primitive element may be the primitive element α of $GF(2^m)$. The first preset number may be equal to p. As illustrated in FIG. 8, the power of the primitive element α corresponding to the register 804-1 may be $\alpha^{-p}$, the power of the primitive element α corresponding to the register 804-2 may be $\alpha^{-2p}$, . . . , and the power of the primitive element α corresponding to the register 804-t may be $\alpha^{-tp}$.

In 706, for each cycle of a plurality of first cycles, the BCH decoder 116 (e.g., the error location determination module 208) may, update each first register by multiplying a current value of the first register with the corresponding power of the primitive element. As disclosed in the present disclosure, the plurality of first cycles may correspond to the σ cycles.

In 708, the BCH decoder 116 (e.g., the error location determination module 208) may determine the set of initial elements based on the updated values of the set of first registers. As illustrated in FIG. 8, the t initial elements may correspond to the updated values of the t registers after the σ cycles. The t registers may determine the t initial elements simultaneously. Each register may determine one of the t initial elements.

Taking the initial element $\lambda'_1$ ($\lambda'_1 = \alpha^{-p\sigma}$) for an example, operations 706 and 708 are described in detail. In the first cycle, the multiplier 802-1 may multiply the current value of the register 804-1 (i.e., one) with $\alpha^{-p}$ to produce a product $\alpha^{-p}$. After the first cycle, the value of the register 804-1 may be updated to be the product $\alpha^{-p}$. In the second cycle, the multiplier 802-1 may multiply the current value of the register 804-1 (i.e., $\alpha^{-p}$) with $\alpha^{-p}$ to produce a product $\alpha^{-2p}$. After the second cycle, the value of the register 804-1 may be updated to be the product $\alpha^{-2p}$. The value of the register 804-1 may be updated after each cycle. In the last cycle (i.e., $\sigma^{th}$ cycle), the multiplier 802-1 may multiply the current value the register 804-1 (i.e., $\alpha^{-(\sigma-1)p}$) with $\alpha^{-p}$ to produce a product $\alpha^{-p\sigma}$. After the last cycle, the value of the register 804-1 may be updated to be the product $\alpha^{-p\sigma}$. The BCH decoder 116 may determine the updated value $\sigma\alpha^{-p\sigma}$ as the initial element corresponding to the register 804-1.

Therefore, in each cycle, the current value of each register in FIG. 8 may be described as $\alpha^{-pj*(c-1)}$, j=1, 2, . . . , t. c represents the sequence number of each cycle, c=1, 2, . . . , σ. In each cycle, the BCH decoder 116 may update each register by multiplying the current value of the register with the corresponding power of the primitive element α (i.e., $\alpha^{-pj}$, j=1, 2, . . . , t). The BCH decoder 116 may determine the updated values of the t registers obtained after the last cycle (i.e., $\sigma^{th}$ cycle) as the t initial elements.

During the second time interval, the BCH decoder 116 may identify one or more error locations corresponding to the one or more errors in the codeword based on the t initial elements determined during the first time interval. The BCH decoder 116 may perform operations 710 and 712 to evaluate the error locator polynomial to identify one or more error locations corresponding to one or more errors in the codeword. In some embodiments, operation 310 of the process 300 in FIG. 3 may be implemented by performing operations 710 and 712.

In 710, the BCH decoder 116 (e.g., the error location determination module 208) may determine, in each cycle of a plurality of second cycles, a second preset number of values. Each of the second preset number of values may correspond to one data bit of the codeword. Each of the second preset number of values may be a value of the error locator polynomial. As disclosed in the present disclosure, the second preset number may be equal to the first preset number and be equal to p. The plurality of second cycles may correspond to the number of cycles for processing the n data bits of the codeword. The plurality of second cycles may also correspond to the σ cycles $$\left(\sigma = \left\lceil \frac{n}{p} \right\rceil\right).$$

In 712, the BCH decoder 116 (e.g., the error location determination module 208) may evaluate, based on the second preset number (i.e., p) of values, the error locator polynomial to identify one or more error locations corresponding to the one or more errors in the codeword.

During the evaluation of the error locator polynomial to identify one or more error locations corresponding to the one or more errors in the codeword, the BCH decoder 116 may determine, for each of the n data bits, a corresponding value of the error locator polynomial $\lambda(x)$ ($\lambda(x) = \lambda_0 + \lambda_1 x + \lambda_2 x^2 + \ldots + \lambda_t x^t$). For example, the BCH decoder 116 may use a Chien search algorithm to determine a value $\lambda(\alpha^i)$ (i=1, 2, . . . , n) of the error locator polynomial for all the n data bits. The BCH decoder 116 may evaluate the error locator polynomial by determining whether $\lambda(\alpha^i)$ is equal to zero. If $\lambda(\alpha^i)$ is equal to zero, the BCH decoder 116 may determine that $\alpha^i$ is a root of the error locator polynomial $\lambda(x)$. The BCH decoder 116 may then identify that the bit in bit position n-i is an erroneous bit. If $\lambda(\alpha^i)$ is not equal to zero, the BCH decoder 116 may determine that $\alpha^i$ is not a root of the error locator polynomial $\lambda(x)$. The BCH decoder 116 may then determine that an error is not detected in bit position n-i.

Figure 9:
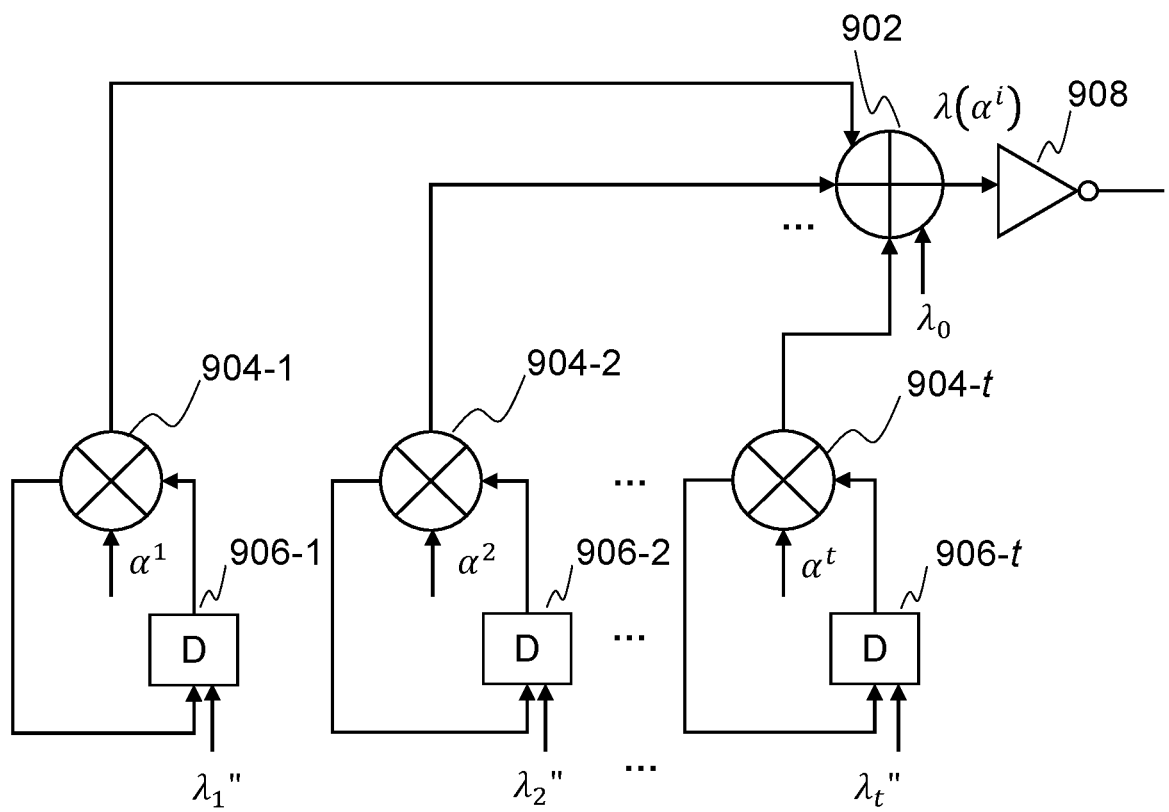
FIG. 9 is a schematic diagram illustrating an exemplary Chien search circuit according to some embodiments of the present disclosure.

In some embodiments, during the evaluation of the error locator polynomial, the BCH decoder 116 may be able to process one data bit (including determining a value of the error locator polynomial for the data bit, determining whether the value is equal to zero, etc.) in a cycle, i.e., p=1. For example, FIG. 9 is a schematic diagram illustrating an exemplary Chien search circuit 900 according to some embodiments of the present disclosure. The Chien search circuit 900 may be a part of the BCH decoder 116. For example, the error location determination module 208 may include the Chien search circuit 900 to implement operations 710 and 712. The Chien search circuit 900 may be able to process one data bit in a cycle. The Chien search circuit 900 may need n cycles to process the n data bits.

As shown in FIG. 9, the Chien search circuit 900 may include an adder 902, t multipliers, t registers and a NOT gate 908. The t multipliers may include multiplier 904-1, multiplier 904-2, . . . , and multiplier 904-t. The t registers may include register 906-1, register 906-2, . . . , and register 906-t.

In some embodiments, the BCH decoder 116 (e.g., the Chien search circuit 900) may receive the t initial elements from the circuit 800. The BCH decoder 116 may receive the error locator polynomial $\lambda(x)$ (or the coefficients of the error locator polynomial $\lambda(x)$) from the error locator polynomial module 206. The BCH decoder 116 may determine t initial values based on the t initial elements ($\lambda'_j = \alpha^{-pj\sigma}$, j=1, 2, . . . , t) and t coefficients ($\lambda_1, \lambda_2, \ldots, \lambda_t$) of the error locator polynomial. The t initial values may be denoted by $\lambda''_j$, j=1, 2, . . . , t. Each initial value may be the product of an initial element and a corresponding coefficient, i.e., $\lambda''_j = \lambda_j * \alpha^{-pj\sigma}$, j=1, 2, . . . , t. The BCH decoder 116 may initialize the t registers in FIG. 9 to the t initial values $\lambda''_1, \lambda''_2, \ldots, \lambda''_t$. Each initial value may correspond to a register. For example, an initial value $\lambda''_1$ corresponds to the register 906-1, an initial value $\lambda''_2$ corresponds to the register 906-2, . . . , and an initial value $\lambda''_t$ corresponds to the register 906-t.

In each cycle of the n cycles, the Chien search circuit 900 may determine a value of the error locator polynomial and evaluate the error locator polynomial based on the value.

In each cycle, the Chien search circuit 900 may determine values of the t registers. A value of each register may be associated with the initial value of the register and a corresponding power of the primitive element α. The corresponding power of the primitive element α may be associated with a sequence number of each cycle. As illustrated in FIG. 9, in the first cycle, the values of the t registers may be the t initial values $\lambda''_1, \lambda''_2, \ldots, \lambda''_t$. Each of the t multipliers may multiply the initial value of the corresponding register with $\alpha^j$ (j=1, 2, . . . , t) to produce t multiplied elements $\lambda''_1 * \alpha, \lambda''_2 * \alpha^2, \ldots, \lambda''_t * \alpha^t$. The t multiplied elements $\lambda''_1 * \alpha, \lambda''_2 * \alpha^2, \ldots, \lambda''_t * \alpha^t$ may be stored in the t registers. In the second cycle, the values of the t registers may be updated to be the t multiplied elements $\lambda''_1 * \alpha, \lambda''_2 * \alpha^2, \ldots, \lambda''_t * \alpha^t$ obtained in the first cycle. Similarly, in the $c^{th}$ (c=1, 2, ..., n) cycle, the values of the t registers may be the t multiplied elements $\lambda''_1*\alpha^{(c-1)}$, $\lambda''_2*\alpha^{2*(c-1)}$, ..., $\lambda''_t*\alpha^{t*(c-1)}$ obtained in the $(c-1)^{th}$ cycle. Therefore, in each cycle, the value of each register may be described as $\lambda''_j*\alpha^{j*(c-1)}$. The value of each register may be the product of the initial value of the register and $\alpha^{j*(c-1)}$ where c represent the sequence number of each cycle.

In each cycle, each multiplier may multiply the value of each register with a corresponding power of the primitive element α to produce t products. As shown in FIG. 9, the corresponding power of the primitive element α may be $\alpha^1$, $\alpha^2$, ..., $\alpha^t$. The adder 902 may receive the t products from the output of the t multipliers. The adder 902 may sum the t products with a coefficient $\lambda_0$ of error locator polynomial to produce an evaluation value (also referred to as a value) $\lambda(\alpha^i)$ (i=1, 2, ..., n) of the error locator polynomial. The output of the adder 902 may be coupled with the input of the NOT gate 908. In some embodiments, if the evaluation value $\lambda(\alpha^i)$ is equal to zero, the adder 902 may output a logic 0. Accordingly, the NOT gate 908 may output a logic 1, which indicates that $\alpha^i$ is a root of the error locator polynomial $\lambda(x)$. The BCH decoder 116 may then identify that the bit in bit position n−i is an erroneous bit. If the evaluation value $\lambda(\alpha^i)$ is not equal to zero, the adder 902 may output a logic 1. Accordingly, the NOT gate 908 may output a logic 0, which indicates that $\alpha^i$ is not a root of the error locator polynomial $\lambda(x)$. The BCH decoder 116 may then determine that an error is not detected in bit position n−i.

The BCH decoder 116 may process the n data bits (i.e., $r_0$, $r_1$ $r_2$, ..., $r_{n-1}$) from the bit in bit position n−1 (i.e., the bit $r_{n-1}$) down to the bit in bit position 0 (i.e., the bit $r_0$. The BCH decoder 116 may substitute all the n data bits into the error locator polynomial. To determine whether the bit $r_{n-i}$ (i=1, 2, ..., n) is an erroneous bit, the BCH decoder 116 may determine whether $\lambda(\alpha^i)$ is equal to zero. For example, as illustrated in FIG. 9, in the first cycle, the Chien search circuit 900 may determine whether the bit $r_{n-1}$ is an erroneous bit. Accordingly, the Chien search circuit 900 may determine an evaluation value $\lambda(\alpha^1)$ of the error locator polynomial in the first cycle. In the first cycle, the values of the t registers may be the t initial values $\lambda''_1$, $\lambda''_2$, ..., $\lambda''_t$. Each of the t multipliers may multiply a value of each register with a corresponding power of the primitive element α to produce t products $\lambda''_1*\alpha$, $\lambda''_2*\alpha^2$, ..., $\lambda''_t*\alpha^t$. The adder 902 may sum the t products $\lambda''_1*\alpha$, $\lambda''_2*\alpha^2$, ..., $\lambda''_t*\alpha^t$ with the coefficient $\lambda_0$ to produce the evaluation value $\lambda(\alpha^i)$, i.e., $\lambda(\alpha^1)=\lambda_0+\lambda'_1*\alpha^1+\lambda''_2\alpha^2+...+\lambda''_t*\alpha^t$. If the evaluation value $\lambda(\alpha^1)$ is equal to zero, the adder 902 may output a logic 0. Accordingly, the NOT gate 908 may output a logic 1, which indicates that $\alpha^1$ is a root of the error locator polynomial $\lambda(x)$. The BCH decoder 116 may then identify that the bit in bit position n−1 is an erroneous bit. If the evaluation value $\lambda(\alpha^1)$ is not equal to zero, the adder 902 may output a logic 1. Accordingly, the NOT gate 908 may output a logic 0, which indicates that $\alpha^1$ is not a root of the error locator polynomial $\lambda(x)$. The BCH decoder 116 may then determine that an error is not detected in bit position n−1.

Figure 10:
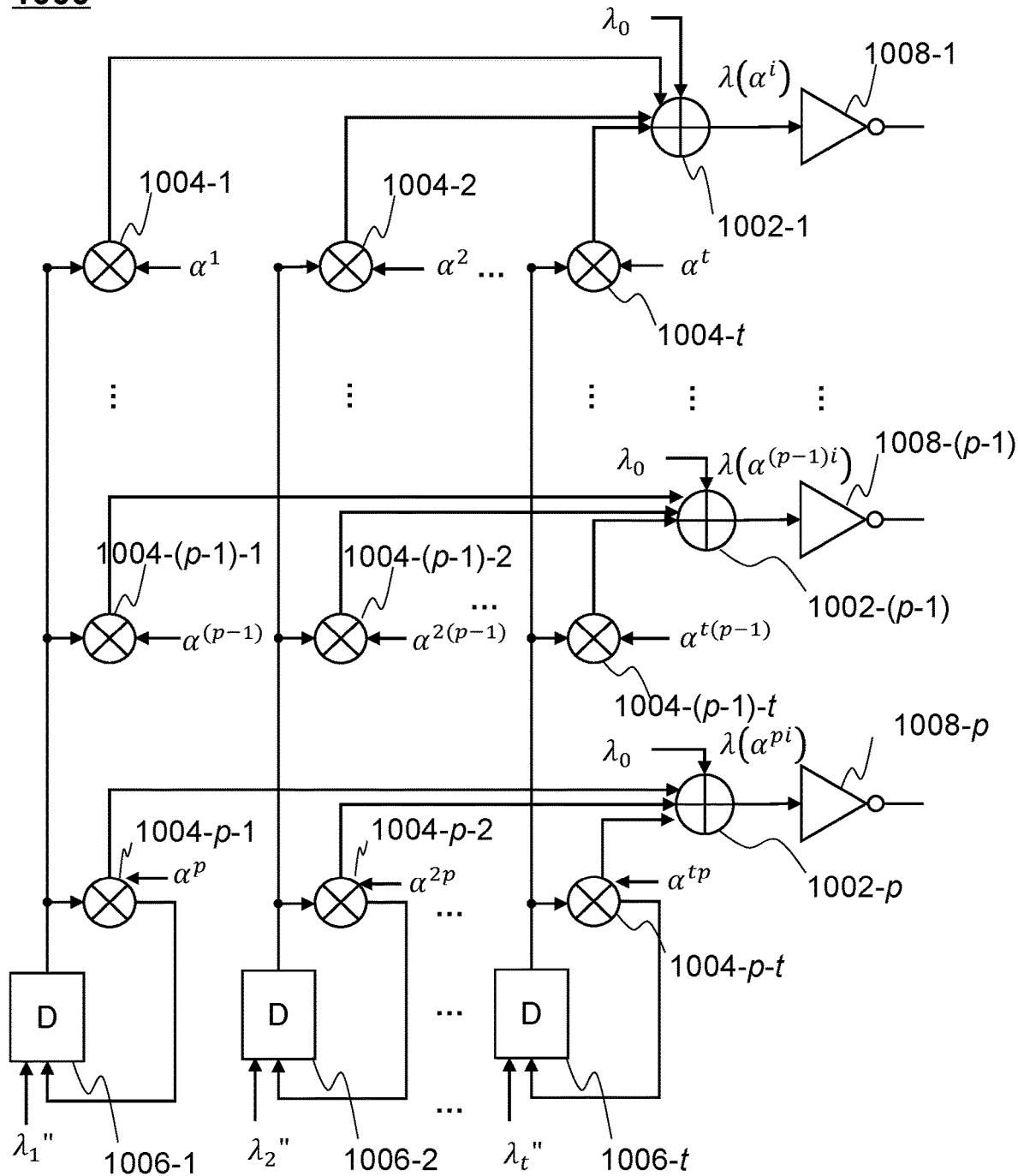
FIG. 10 is a schematic diagram illustrating an exemplary Chien search circuit according to some embodiments of the present disclosure.

In some embodiments, during the evaluation of the error locator polynomial, the BCH decoder 116 may be able to process more than one data bit in a cycle, i.e., p>1. For example, FIG. 10 is a schematic diagram illustrating an exemplary Chien search circuit 1000 according to some embodiments of the present disclosure. The Chien search circuit 1000 may be a part of the BCH decoder 116. For example, the error location determination module 208 may include the Chien search circuit 1000 to implement operations 710 and 712. The Chien search circuit 1000 may be able to process p (p>1, e.g., 64) data bits in a cycle. The Chien search circuit 900 may need $$\left\lceil \frac{n}{p} \right\rceil$$

cycles to process the n data bits.

As shown in FIG. 10, the Chien search circuit 1000 may include p adders, t*p multipliers, t registers and p NOT gates. The p adders may include adder 1002-1, ..., adder 1002-(p−1), and adder 1002-p. The t*p multipliers 1004 may be divided into p groups, each including t multipliers. Each adder may correspond to one of the p groups of multipliers. For example, the adder 1002-1 may correspond to multiplier 1004-1, multiplier 1004-2, ..., and multiplier 1004-t. The adder 1002-(p−1) may correspond to multiplier 1004-(p−1)-1, multiplier 1004-(p−1)-2, ..., and multiplier 1004-(p−1)-t. The adder 1002-p may correspond to multiplier 1004-p-1, multiplier 1004-p-2, ..., and multiplier 1004-p-t. The t registers may include register 1006-1, register 1006-2, ..., and register 1006-t. The p NOT gates may include NOT gate 1008-1, ..., NOT gate 1008-(p−1), and NOT gate 1008-p.

Similar to the Chien search circuit 900 in FIG. 9, the BCH decoder 116 may initialize the t registers of the Chien search circuit 1000 to the t initial values $\lambda''_1$, $\lambda''_2$, ..., $\lambda''_t$. Each initial value may correspond to a register. For example, the initial value $\lambda''_1$ corresponds to the register 1006-1, the initial value $\lambda''_2$ corresponds to the register 1006-2, ..., and the initial value $\lambda''_t$ corresponds to the register 1006-t.

In each cycle of the $$\left\lceil \frac{n}{p} \right\rceil$$

cycles, the Chien search circuit 1000 may determine p values of the error locator polynomial and evaluate the error locator polynomial based on the p values.

In each cycle, the Chien search circuit 1000 may determine values of the t registers. A value of each register may be associated with the initial value of the register and a corresponding power of the primitive element α. The corresponding power of the primitive element α may be associated with a sequence number of each cycle. As illustrated in FIG. 10, in the first cycle, the values of the t registers may be the t initial values $\lambda''_1$, $\lambda''_2$, ..., $\lambda''_t$. Each of the t multipliers including the multiplier 1004-p-1, the multiplier 1004-p-2, ..., and the multiplier 1004-p-t may multiply the initial value of the corresponding register with $\alpha^{pj}$ (j=1, 2, ..., t) to produce t multiplied elements $\lambda''_1*\alpha^p$, $\lambda''_2*\alpha^{2p}$, ..., $\lambda''_t*\alpha^{tp}$. The t multiplied elements $\lambda''_1*\alpha^p$, $\lambda''_2*\alpha^{2p}$, ..., $\lambda''_t*\alpha^{tp}$, may be stored in the t registers. In the second cycle, the values of the t registers may be updated to be the t multiplied elements $\lambda''_1*\alpha^p$, $\lambda''_2*\alpha^{2p}$, ..., $\lambda''_t*\alpha^{tp}$ obtained in the first cycle. Similarly, in the $c^{th}$ $$\left(c = 1, 2, \ldots, \left\lceil \frac{n}{p} \right\rceil\right)$$

cycle, the values of the t registers may be the t multiplied elements $\lambda"_1*\alpha^{p*(c-1)}$, $\lambda"_2*\alpha^{2p*(c-1)}$, ..., $\lambda"_t*\alpha^{tp*(c-1)}$ obtained in the $(c-1)^{th}$ cycle. Therefore, in each cycle, the value of each register may be described as $\lambda"_j*\alpha^{jp*(c-1)}$. The value of each register may be the product of the initial value of the register and $\alpha^{jp*(c-1)}$ where c represent the sequence number of each cycle.

In each cycle, each multiplier may multiply the value of each register with a corresponding power of the primitive element α to produce r p products. As illustrated in FIG. 10, the corresponding power of the primitive element α may be $\alpha^1, \alpha^2, \ldots \alpha^t, \alpha^{(p-1)}, \alpha^{t(p-1)}, \ldots \alpha^{t(p-1)}, \alpha^p, \alpha^{2p}, \ldots \alpha^{tp}$. Each of the p adders may sum t products with the coefficient $\lambda_0$ to produce an evaluation value (e.g., $\lambda(\alpha^i)$, $\lambda(\alpha^{(p-1)i})$, $\lambda(\alpha^{pi})$ illustrated in FIG. 10) of the error locator polynomial. For example, the adder 1002-1 may sum t products of the multiplier 1004-1, the multiplier 1004-2, ..., and the multiplier 1004-t with the coefficient $\lambda_0$ to produce the evaluation value $\lambda(\alpha^i)$ of the error locator polynomial. The output of each of the p adders may be coupled with the input of a NOT gate (e.g., the NOT gate 1008-1, ..., the NOT gate 1008-(p-1), or the NOT gate 1008-p). If an evaluation value is equal to zero, the corresponding adder may output a logic 0. The corresponding NOT gate may output a logic 1. For example, if the evaluation value $\lambda(\alpha^i)$ is equal to zero, the adder 1002-1 may output a logic 0. Accordingly, the NOT gate 1008-1 may output a logic 1, which indicates that $\alpha^i$ is a root of the error locator polynomial λ(x). The BCH decoder 116 may then identify that the bit in bit position n−i is an erroneous bit. If the evaluation value $\lambda(\alpha^i)$ is not equal to zero, the adder 1002-1 may output a logic 1. Accordingly, the NOT gate 1008-1 may output a logic 0, which indicates that $\alpha^i$ is not a root of the error locator polynomial λ(x). The BCH decoder 116 may then determine that an error is not detected in bit position n−i.

The BCH decoder 116 may process the n data bits (i.e., $r_0$, $r_1$, $r_2$, ..., $r_{n-1}$) from the bit in bit position n−1 (i.e., the bit $r_{n-1}$) down to the bit in bit position 0 (i.e., the bit $r_0$). The BCH decoder 116 may substitute all the n data bits into the error locator polynomial. To determine whether the bit $r_{n-i}$ (i=1, 2, ..., n) is an erroneous bit, the BCH decoder 116 may determine whether $\lambda(\alpha^i)$ is equal to zero. For example, in the first cycle, the Chien search circuit 1000 may process p data bits including $r_{n-1}, r_{n-p+1}, r_{n-p}$. Accordingly, in the first cycle, the Chien search circuit 1000 may determine p evaluation values of the error locator polynomial including $\lambda(\alpha^1), \ldots, \lambda(\alpha^{p-1}), \lambda(\alpha^p)$, where the parameter i shown in FIG. 10 is equal to 1.

In the first cycle, the values of the t registers may be the t initial values $\lambda"_1, \lambda"_2, \ldots, \lambda"_t$. In the first cycle, each of the t multipliers including the multiplier 1004-1, the multiplier 1004-2, ..., and the multiplier 1004-t may multiply a value of each register with a corresponding power of the primitive element α to produce t products $\lambda"_1*\alpha^1, \lambda"_2*\alpha^2, \ldots, \lambda"_t*\alpha^t$. Each of the t multipliers including the multiplier 1004-(p−1)-1, the multiplier 1004-(p−1)-2, ..., and the multiplier 1004-(p−1)-t may multiply the value of each register with a corresponding power of the primitive element α to produce t products $\lambda"_1*\alpha^{(p-1)}, \lambda"_2*\alpha^{2(p-1)}, \ldots, \lambda"_t*\alpha^{t(p-1)}$. Each of the t multipliers including the multiplier 1004-p-1, the multiplier 1004-p-2, ..., and the multiplier 1004-p-t may multiply a current value of each register with a corresponding power of the primitive element α to produce t products $\lambda"_1*\alpha^p, \lambda"_2*\alpha^{2p}, \ldots, \lambda"_t*\alpha^{tp}$.

The adder 1002-1 may sum the t products $\lambda"_1*\alpha^1, \lambda"_2*\alpha^2, \ldots, \lambda"_t*\alpha^t$, with the coefficient $\lambda_0$ to produce the evaluation value $\lambda(\alpha^1)$, i.e., $\lambda(\alpha^1)=\lambda_0+\lambda"_1*\alpha^1+\lambda"_2*\alpha^2+\ldots+\lambda"_t*\alpha^t$. The adder 1002-(p−1) may sum the t products $\lambda"_1*\alpha^{(p-1)}, \lambda"_2*\alpha^{2(p-1)}, \ldots, \lambda"_t*\alpha^{t(p-1)}$ with the coefficient $\lambda_0$ to produce the evaluation value $\lambda(\alpha^{(p-1)})$, i.e., $\lambda(\alpha^{(p-1)})=\lambda_0+\lambda"_1*\alpha^{(p-1)}+\lambda"_2*\alpha^{2(p-1)}+\ldots+\lambda"_t*\alpha^{t(p-1)}$. The adder 1002-p may sum the t products $\lambda"_1*\alpha^p, \lambda"_2*\alpha^{2p}, \ldots, \lambda"_t*\alpha^{tp}$ with the coefficient $\lambda_0$ to produce the evaluation value $\lambda(\alpha^p)$, i.e., $\lambda(\alpha^p)=\lambda_0+\lambda"_1*\alpha^p+\lambda"_2*\alpha^{2p}+\ldots+\lambda"_t*\alpha^{tp}$. The BCH decoder 116 may evaluate the error locator polynomial based on the p evaluation values. For example, if the evaluation value $\lambda(\alpha^1)$ is equal to zero, the adder 1002-1 may output a logic 0. Accordingly, the NOT gate 1008-1 may output a logic 1, which indicates that $\alpha^1$ is a root of the error locator polynomial λ(x). The BCH decoder 116 may then identify that the bit in bit position n−1 is an erroneous bit. If the evaluation value $\lambda(\alpha^1)$ is not equal to zero, the adder 1002-1 may output a logic 1. Accordingly, the NOT gate 908 may output a logic 0, which indicates that $\alpha^1$ is not a root of the error locator polynomial λ(x). The BCH decoder 116 may then determine that an error is not detected in bit position n−1.

Figure 11:
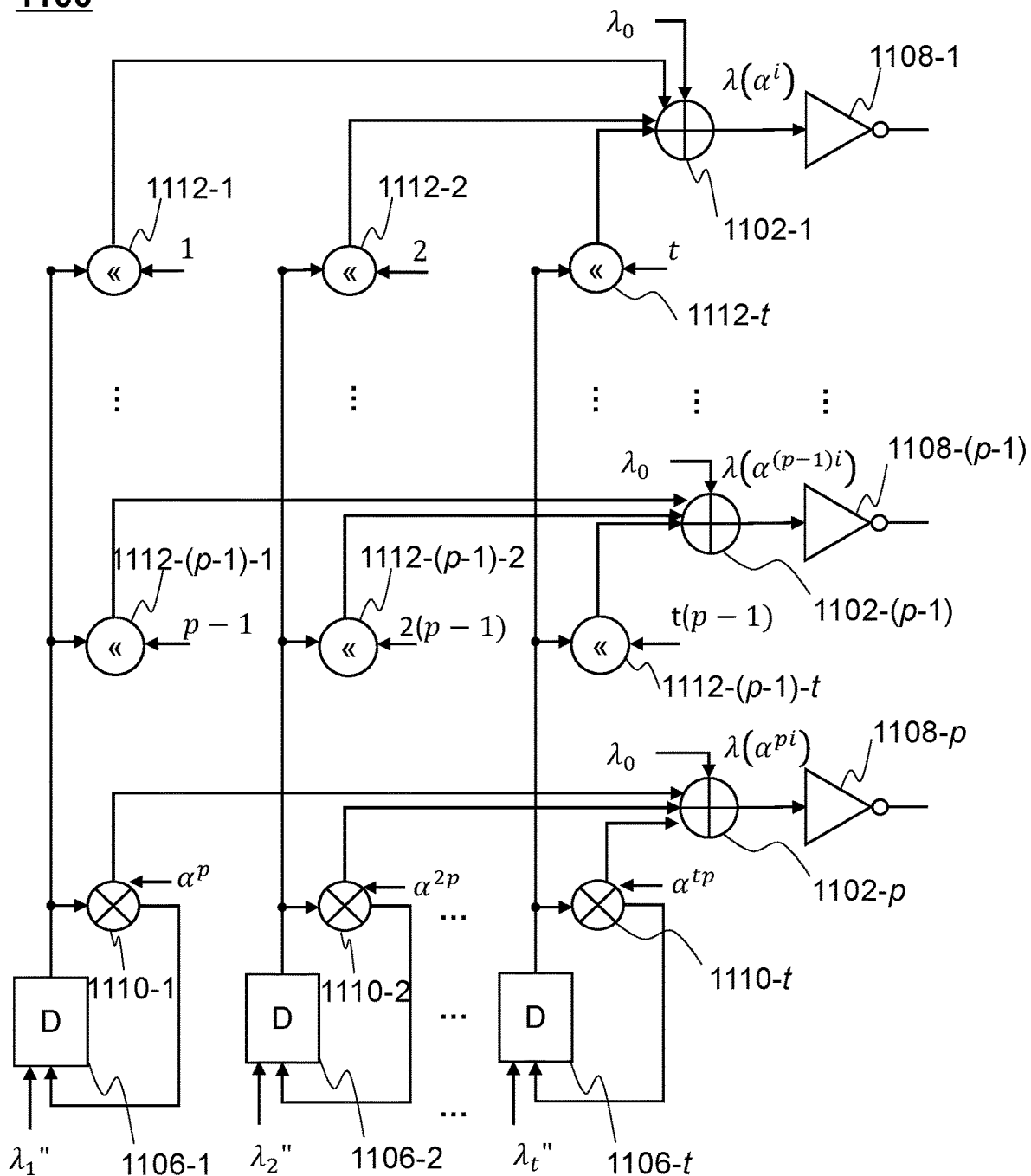
FIG. 11 is a schematic diagram illustrating an exemplary Chien search circuit according to some embodiments of the present disclosure.

The Chien search circuit 1000 may process p (p>1) data bits in a cycle. Thus the decoding throughput (e.g., bits processed/decoded per second) of the BCH decoder 116 using the Chien search circuit 1000 may be greater than the decoding throughput of the BCH decoder 116 using the Chien search circuit 900. However, in the aspect of hardware implementation, the Chien search circuit 1000 may require a large area. To reduce the area consumption of the BCH decoder 116, the complexity of the Chien search circuit 1000 may need to be reduced. In some embodiments, the number of multipliers in the Chien search circuit 1000 may be reduced. For example, FIG. 11 is a schematic diagram illustrating an exemplary Chien search circuit 1100 according to some embodiments of the present disclosure. The Chien search circuit 1100 may be a part of the BCH decoder 116. For example, the error location determination module 208 may include the Chien search circuit 1100 to implement operations 710 and 712.

As shown in FIG. 11, the Chien search circuit 1100 may include p adders, t multipliers, t registers, t*(p−1) shifters, and p NOT gates. The p adders may include adder 1102-1, ..., adder 1102-(p−1), and adder 1102-p. The t multipliers may include multiplier 1110-1, multiplier 1110-2, ..., and multiplier 1110-t. The adder 1102-p may correspond to the t multipliers. The t*(p−1) shifters may be divided into (p−1) groups, each including t shifters. Each of the (p−1) adders including the adder 1102-1, ..., the adder 1102-(p−1) may correspond to one of the (p−1) groups of shifters. For example, the adder 1102-1 may correspond to shifter 1112-1, shifter 1112-2, ..., and shifter 1112-t. The adder 1102-(p−1) may correspond to shifter 1112-(p−1)-1, shifter 1112-(p−1)-2, ..., and shifter 1112-(p−1)-t. The t registers may include register 1106-1, register 1106-2, ..., and register 1106-t. The p NOT gates may include NOT gate 1108-1, ..., NOT gate 1108-(p−1), and NOT gate 1108-p.

As shown in FIG. 11 and FIG. 10, the t*(p−1) multipliers of the Chien search circuit 1000 are replaced with the t*(p−1) shifters of the Chien search circuit 1100, and the corresponding t*(p−1) multiplication operations are replaced with t*(p−1) shift operations. The t multipliers corresponding to $\alpha^p, \alpha^{2p}, \ldots, \alpha^{2t}$ are remained in FIG. 11. A shifter represents a shift operation on a value (e.g., the value of a register as illustrated in FIG. 11), and may consume no area. Accordingly, the t*(p−1) shifters may consume no area. Thus the area of the Chien search circuit 1100 may be reduced compared to that of the Chien search circuit 1000. Consequently, the area consumption of the BCH decoder 116 using the Chien search circuit 1100 is reduced and an area-efficient BCH decoder is obtained.

During the evaluation of the error locator polynomial, the Chien search circuit 1100 may be able to process p (p>1, e.g., 64) data bits in a cycle. The Chien search circuit 1100 may need $$\left\lceil \frac{n}{p} \right\rceil$$

cycles to process the n data bits.

Similar to the Chien search circuit 900 in FIG. 9 or the Chien search circuit 1000 in FIG. 10, the BCH decoder 116 may initialize the t registers of the Chien search circuit 1000 to the t initial values $\lambda''_1, \lambda''_2, \ldots, \lambda''_t$. Each initial value may correspond to a register. For example, the initial value $\lambda''_1$ corresponds to the register 1106-1, the initial value $\lambda''_2$ corresponds to the register 1106-2, . . . , and the initial value $\lambda''_t$ corresponds to the register 1106-t.

In each cycle of the $$\left\lceil \frac{n}{p} \right\rceil$$

cycles, the Chien search circuit 1100 may determine p values of the error locator polynomial and evaluate the error locator polynomial based on the p values.

In each cycle, the Chien search circuit 1100 may determine values of the t registers. A value of each register may be associated with the initial value of the register and a corresponding power of the primitive element α. The corresponding power of the primitive element α may be associated with a sequence number of each cycle. As illustrated in FIG. 11, in the first cycle, the values of the t registers may be the t initial values $\lambda''_1, \lambda''_2, \ldots, \lambda''_t$. Each of the t multipliers may multiply the initial value of the corresponding register with $\alpha^{pj}$ (j=1, 2, . . . , t) to produce t multiplied elements $\lambda''_1 * \alpha^p, \lambda''_2 * \alpha^{2p}, \ldots, \lambda''_t * \alpha^{tp}$. The t multiplied elements $\lambda''_1 * \alpha^p, \lambda''_2 * \alpha^{2p}, \ldots, \lambda''_t * \alpha^{tp}$ may be stored in the t registers. In the second cycle, the values of the t registers may be updated to be the t multiplied elements $\lambda''_1 * \alpha^p, \lambda''_2 * \alpha^{2p}, \ldots, \lambda''_t * \alpha^{tp}$ obtained in the first cycle. Similarly, in the $c^{th}$ $$\left(c = 1, 2, \ldots, \left\lceil \frac{n}{p} \right\rceil\right)$$

cycle, the values of the t registers may be the t multiplied elements $\lambda''_1 * \alpha^{p*(c-1)}, \lambda''_2 * \alpha^{2p(c-1)}, \ldots, \lambda''_t * \alpha^{tp(c-1)}$ obtained in the (c-1)$^{th}$ cycle. Therefore, in each cycle, the value of each register may be described as $\lambda''_j * \alpha^{jp(c-1)}$. The value of each register may be the product of the initial value of the register and $\alpha^{jp(c-1)}$, where c represent the sequence number of each cycle.

In each cycle, each of the t multipliers (e.g., the multiplier 1110-1, the multiplier 1110-2, . . . , or the multiplier 1110-t) may multiply a value of each register with a corresponding power of the primitive element α to produce t products. As illustrated in FIG. 11, the corresponding power of the primitive element α may be $\alpha^p, \alpha^{2p}, \ldots, \alpha^{tp}$. The adder 1102-p may sum the t products with the coefficient $\lambda_0$ of the error locator polynomial to produce an evaluation value $\lambda(\alpha^{pt})$ of the error locator polynomial.

In each cycle, each of the t*(p-1) shifters may shift the value of each register by a number of bits to produce a shifted value. The number of bits may be associated with the corresponding power of the primitive element α corresponding to the multiplication operation in FIG. 10. For example, multiplying a value with $\alpha^q$ (q is a positive integer) in FIG. 10 is equivalent to shifting the value to the left by q bits in FIG. 11. The adder 1102-1 may sum t shifted values received from the shifter 1112-1, the shifter 1112-2, . . . , and the shifter 1112-t with the coefficient $\lambda_0$ to produce an evaluation value $\lambda(\alpha^i)$ of the error locator polynomial. The adder 1102-(p-1) may sum t shifted values received from the shifter 1112-(p-1)-1, the shifter 1112-(p-1)-2, . . . , and the shifter 1112-(p-1)-t with the coefficient $\lambda_0$ to produce an evaluation value $\lambda(\alpha^{(p-1)t})$ of the error locator polynomial.

The output of each of the p adders may be coupled with the input of a NOT gate (e.g., the NOT gate 1108-1, . . . , the NOT gate 1108-(p-1), or the NOT gate 1108-p). The BCH decoder 116 may evaluate the error locator polynomial based on the evaluation values (e.g., $\lambda(\alpha^i), \ldots, \lambda(\alpha^{(p-1)t}, \lambda(\alpha^{pi}))$. For example, if the evaluation value $\lambda(\alpha^i)$ is equal to zero, the adder 1102-1 may output a logic 0. Accordingly, the NOT gate 1108-1 may output a logic 1, which indicates that $\alpha^i$ is a root of the error locator polynomial $\lambda(x)$. The BCH decoder 116 may then identify that the bit in bit position n-i is an erroneous bit. If the evaluation value $\lambda(\alpha^i)$ is not equal to zero, the adder 1102-1 may output a logic 1. Accordingly, the NOT gate 1108-1 may output a logic 0, which indicates that $\alpha^i$ is not a root of the error locator polynomial $\lambda(x)$. The BCH decoder 116 may then determine that an error is not detected in bit position n-i.

The BCH decoder 116 may process the n data bits (i.e., $r_0, r_1, r_2, r_{n-1}$) from the bit in bit position n-1 (i.e., the bit $r_{n-1}$) down to the bit in bit position 0 (i.e., the bit $r_0$. The BCH decoder 116 may substitute all the n data bits into the error locator polynomial. To determine whether the bit $r_{n-1}$ (i=1, 2, . . . , n) is an erroneous bit, the BCH decoder 116 may determine whether $\lambda(\alpha^i)$ is equal to zero. For example, in the first cycle, the Chien search circuit 1100 may process p data bits including $r_{n-1}, r_{n-p+1}, r_{n-p}$. Accordingly, in the first cycle, the Chien search circuit 1100 may determine p evaluation values of the error locator polynomial including $\lambda(\alpha^1), \ldots, \lambda(\alpha^{p-1}), \lambda(\alpha^p)$, where the parameter i shown in FIG. 11 is equal to 1.

In the first cycle, the values of the t registers may be the t initial values $\lambda''_1, \lambda''_2, \ldots, \lambda''_t$. In the first cycle, each of the t shifters including the shifter 1112-1, the shifter 1112-2, . . . , and the shifter 1112-t may shift the value of each register to the left by a corresponding number of bits to produce t shifted values $\lambda''_1 \ll 1, \lambda''_2 \ll 2, \ldots, \lambda''_t \ll t$. Each of the t shifters including 1112-(p-1)-1, the shifter 1112-(p-1)-2, . . . , and the shifter 1112-(p-1)-t may shift the value of each register to the left by a corresponding number of bits to produce t shifted values $\lambda''_1 \ll (p-1), \lambda''_2 \ll 2(p-1), \ldots, \lambda''_t \ll t(p-1)$. Each of the t multipliers may multiply the value of each register with a corresponding power of the primitive element α to produce t products $\lambda''_1 * \alpha^p, \lambda''_2 * \alpha^{2p}, \ldots, \lambda''_t * \alpha^{tp}$.

The adder 1102-1 may sum the t shifted values $\lambda''_1 \ll 1, \lambda''_2 \ll 2, \ldots, \lambda''_t \ll t$ with the coefficient $\lambda_0$ to produce the evaluation value $\lambda(\alpha^i)$, i.e., $\lambda(\alpha^1) = \lambda_0 + \lambda''_1 \ll 1 + \lambda''_2 \ll 2 + \ldots + \lambda''_t \ll t$. The adder 1102-(p-1) may sum the t shifted values $\lambda''_1 \ll (p-1), \lambda''_2 \ll 2(p-1), \ldots, \lambda''_t \ll t(p-1)$ with the coefficient $\lambda_0$ to produce the evaluation value $\lambda(\alpha^{p-1})$, i.e., $\lambda(\alpha^{p-1}) = \lambda_0 + \lambda''_1 \ll (p-1) + \lambda''_2 \ll 2(p-1) + \ldots + \lambda''_t \ll t(p-1)$.

The adder 1102-*p* may sum the t products $\lambda''_1 * \alpha^p$, $\lambda''_2 * \alpha^{2p}$, ..., $\lambda''_t * \alpha^{tp}$ with the coefficient $\lambda_0$ to produce an evaluation value $\lambda(\alpha^p)$, i.e., $\lambda(\alpha^p) = \lambda_0 + \lambda''_1 * \alpha^p + \lambda''_2 * \alpha^{2p} + \ldots + \lambda''_t * \alpha^{tp}$. The BCH decoder 116 may evaluate the error locator polynomial based on the p evaluation values. For example, if the evaluation value $\lambda(\alpha^1)$ is equal to zero, the adder 1102-1 may output a logic 0. Accordingly, the NOT gate 1108-1 may output a logic 1, which indicates that $\alpha^1$ is a root of the error locator polynomial $\lambda(x)$. The BCH decoder 116 may then identify that the bit in bit position n−1 is an erroneous bit. If the evaluation value $\lambda(\alpha^i)$ is not equal to zero, the adder 1102-1 may output a logic 1. Accordingly, the NOT gate 1108-1 may output a logic 0, which indicates that $\alpha^1$ is not a root of the error locator polynomial $\lambda(x)$. The BCH decoder 116 may then determine that an error is not detected in bit position n−1.

It is known that elements of $GF(2^m)$ may be represented as m-bit binary strings. Since the decoding of the BCH decoder 116 is defined over $GF(2^m)$, values that are produced during the operations (e.g., multiplications, additions, shift operations) may need to be values of m bits. In some embodiments, a value that exceeds m bits may be transformed back to an m-bit value. For example, as illustrated in FIG. 11, during the evaluation of the error locator polynomial in each cycle, the value of each register is a value of m bits. By performing the shift operations on the value of each register, the shifted values may be values that exceed m bits. Accordingly, the summation values of the shifted values may also exceed m bits. The evaluation values obtained by the (p−1) adders including the adder 1102-1, ...., and the adder 1102-(*p*−1) may be values that exceed m bits. In some embodiments, the (p−1) evaluation values obtained by the (p−1) adders may be transformed back to values of m bits. In some embodiments, during the evaluation of the error locator polynomial, the BCH decoder 116 may use mod operators to implement the transformation.

Figure 12:
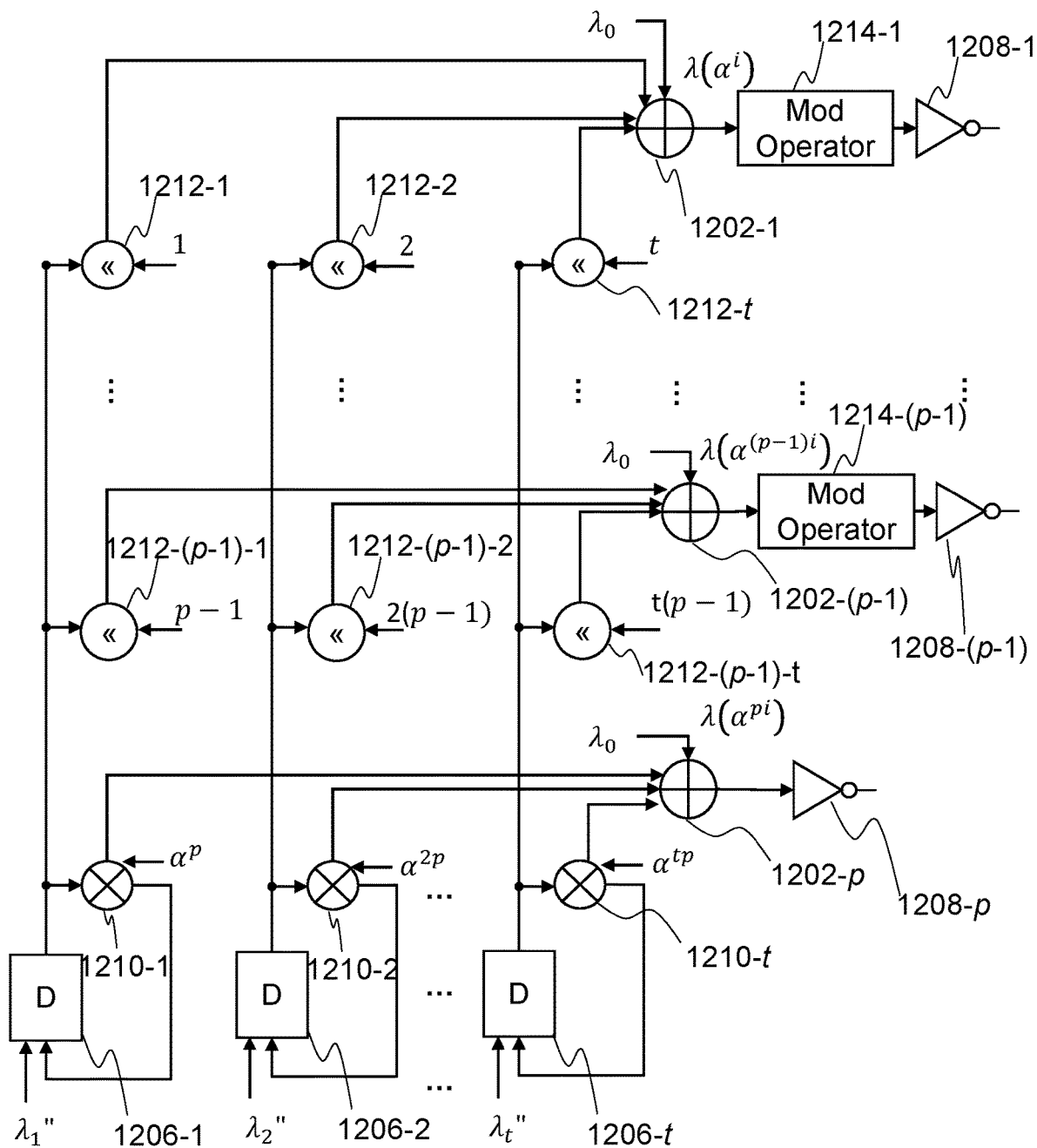
FIG. 12 is a schematic diagram illustrating an exemplary Chien search circuit according to some embodiments of the present disclosure.

For example, FIG. 12 is a schematic diagram illustrating an exemplary Chien search circuit 1200 according to some embodiments of the present disclosure. The Chien search circuit 1200 may be a part of the BCH decoder 116. For example, the error location determination module 208 may include the Chien search circuit 1200 to implement operations 710 and 712. As shown in FIG. 12, the Chien search circuit 1200 may include p adders, t multipliers, t registers, t*(p−1) shifters, p NOT gates, and (p−1) mod operators. The p adders may include adder 1202-1, ..., adder 1202-(*p*−1), and adder 1202-*p*. The t multipliers may include multiplier 1210-1, multiplier 1210-2, ..., and multiplier 1210-*t*. The adder 1202-*p* may correspond to the t multipliers. The t*(p−1) shifters may be divided into (p−1) groups, each including t shifters. Each of the (p−1) adders including the adder 1202-1, ..., and the adder 1202-(*p*−1) and each of the (p−1) mod operators may correspond to one of the (p−1) groups of shifters. For example, the adder 1202-1 and the mod operator 1214-1 may correspond to shifter 1212-1, shifter 1212-2, ..., and shifter 1212-*t*. The adder 1202-(*p*−1) and the mod operator 1214-(*p*−1) may correspond to shifter 1212-(*p*−1)-1, shifter 1212-(*p*−1)-2, ..., and shifter 1212-(*p*−1)-*t*. The t registers may include register 1206-1, register 1206-2, ..., and register 1206-*t*. The p NOT gates may include NOT gate 1208-1, ..., NOT gate 1208-(*p*−1), and NOT gate 1208-*p*. The Chien search circuit 1200 may be a circuit based on the Chien search architecture 1100. Compared with the Chien search circuit 1100 in FIG. 11, the Chien search circuit 1200 may include the additional (p−1) mod operators.

During the evaluation of the error locator polynomial, the Chien search circuit 1200 may be able to process p (p>1, e.g., 64) data bits in a cycle. The Chien search circuit 1200 may need $$\left\lceil \frac{n}{p} \right\rceil$$

cycles to process the n data bits. In each cycle, the Chien search circuit 1200 may determine p values of the error locator polynomial and evaluate the error locator polynomial based on the p values.

During the evaluation of the error locator polynomial in each cycle, the values of the t registers may be values of m bits. By performing the shift operations on the values of the t registers, the shifted values may be values that exceed m bits. For example, for the shifter 1212-1, shifter 1212-2, ..., and the shifter 1212-*t*, the values of the t registers may be respectively shifted to the left by one bit, two bits, ..., and t bits. The number of bits of the corresponding t shifted values may be (m+1) bits, (m+2) bits, ..., and (m+t) bits. As another example, for the shifter 1212-(*p*−1)-1, the shifter 1212-(*p*−1)-2, ..., and the shifter 1212-(*p*−1)-*t*, the values of the t registers may be respectively shifted to the left by (p−1) bits, 2*(p−1) bits, ..., and t*(p−1) bits. The number of bits of the corresponding t shifted values may be m+(p−1) bits, m+2*(p−1) bits, ..., and m+t*(p−1) bits. By performing the summation operations on the shifted values to produce an evaluation value of the error locator polynomial, the number of bits of the evaluation value may correspond to the most number of bits among the shifted values. For example, for the adder 1202-1, the evaluation value (denoted by $\lambda(\alpha^i)$) obtained may be the summation of the coefficient $\lambda_0$ and the t shifted values obtained from the shifter 1212-1, the shifter 1212-2, ..., and the shifter 1212-*t*. The number of bits of the evaluation value $\lambda(\alpha^i)$ may be (m+t) bits. As another example, for the adder 1202-(*p*−1), the evaluation value (denoted by $\lambda(\alpha^{(p-1)i})$) obtained may be the summation of the coefficient $\lambda_0$ and the t shifted values obtained from the shifter 1212-(*p*−1)-1, the shifter 1212-(*p*−1)-2, ..., and the shifter 1212-(*p*−1)-*t*. The number of bits of the evaluation value $\lambda(\alpha^{(p-1)i})$ may be m+t*(p−1) bits. Therefore, the number of bits of the evaluation value $\lambda(\alpha^i)$, ..., $\lambda(\alpha^{(p-1)i})$ may exceed m bits.

In order to transform the (p−1) evaluation values (e.g., $\lambda(\alpha^i)$, ..., $\lambda(\alpha^{(p-1)i})$) back to values of m bits, the (p−1) mod operators may be respectively coupled with the (p−1) adders (e.g., the adder 1202-1, ..., the adder 1202-(*p*−1)). A mod operator over $GF(2^m)$ may be able to transform an evaluation value that exceeds m bits back to a value of m bits. For example, the mod operator 1214-1 may be coupled with the adder 1202-1. The mod operator 1214-1 may perform a modulo operation on the evaluation value $\lambda(\alpha^i)$ to transform the evaluation value $\lambda(\alpha^i)$ to an m-bit value. As another example, the mod operator 1214-(*p*−1) may be coupled with the adder 1202-(*p*−1). The mod operator 1214-(*p*−1) may perform a modulo operation on the evaluation value $\lambda(\alpha^{(p-1)i})$ to transform the evaluation value $\lambda(\alpha^{(p-1)i})$ to an m-bit value.

In some embodiments, the modulo operation may be based on a primitive polynomial of $GF(2^m)$. For example, when performing the modulo operation on an evaluation value (e.g., the evaluation value $\lambda(\alpha^i)$), the corresponding mod operator (e.g., the mod operator 1214-1) may map each bit of the evaluation value to a corresponding power of the primitive element α of GF r) based on a position of the bit in the evaluation value. For example, the evaluation value may include c bits, where c is an appropriate positive integer and is greater than m. The c bits of the evaluation value may be represented as $(e_{c-1}, \ldots, e_2, e_1, e_0)$. A bit $e_j$ (j=0, 1, 2, ..., c−1) may be in bit position j. The bit $e_j$ may correspond to $\alpha^j$. The mod operator may map each of the c bits of the evaluation value to a corresponding polynomial including one or more powers of the primitive element α. The corresponding polynomial may correspond to an m-bit value. In some embodiments, the mod operator may map each of the c bits of the evaluation value to a corresponding polynomial including one or more powers of the primitive element α based on the primitive polynomial of GF($2^m$). The primitive polynomial of GF($2^m$) may be the minimal polynomial of the primitive element α. For a bit $e_j$ (corresponding to $\alpha^j$, (j=0, 1, 2, ..., c−1)) of the evaluation value, the corresponding polynomials may be the reminder of $\alpha^j$ divided by the primitive polynomial. The reminder (i.e., the corresponding polynomial) may include one or more powers of the primitive element α that do not exceed the highest-degree power of GF($2^m$) (i.e., $\alpha^{m-1}$). The reminder may correspond to an m-bit binary string. Therefore, the mod operator may map each bit of the evaluation value to a corresponding polynomial including one or more powers of the primitive element α. The corresponding polynomial may correspond to an m-bit value (i.e., m-bit binary string).

The mod operator may then sum the polynomials corresponding to all bits of the evaluation value to produce a summation value. For example, the mod operator may sum the polynomials corresponding to all the c bits of the evaluation value (i.e., $(e_{c-1}, \ldots, e_2, e_1, e_0)$) to produce a summation value. The summation value may be represented as a polynomial including one or more powers of the primitive element α that do not exceed the highest-degree power of GF($2^m$) (i.e., $\alpha^{m-1}$). Since the polynomials corresponding to all the c bits of the evaluation value correspond to c m-bit values, the summation value corresponding to the evaluation value may correspond to an m-bit value. Therefore, the mod operator may transform the evaluation value to an m-bit value. In some embodiments, to produce the summation value, the mod operator may only sum the polynomials corresponding to the bits of the evaluation value whose bit values are one (i.e., $e_j$=1).

Taking GF($2^4$) as an example, an element of GF($2^4$) may be represented as a 4-bit binary string denoted by such as $(g_3, g_2, g_1, g_0)$. Each of the four bits may correspond to a power of the primitive element α, i.e., the bit $g_0$ corresponds to $\alpha^0$, $g_1$ corresponds to $\alpha^1$, $g_2$ corresponds to $\alpha^2$, and $g_3$ corresponds to $\alpha^3$. $\alpha^3$ may be referred to as the highest-degree power of GF($2^4$). If the power of a bit of an evaluation value (e.g., the evaluation value $\lambda(\alpha^i)$) exceeds the highest-degree of GF($2^4$) (i.e., $\alpha^3$), the number of bits corresponding to the evaluation value may exceed four. In order to transform the evaluation value back to a 4-bit value. The mod operator may map each bit of the evaluation value to a corresponding polynomial including one or more powers of the primitive element α of GF($2^4$) based on the primitive polynomial of GF($2^4$) (represented as p(x)=1+x+). For example, for a bit $e_1$ (corresponding to $\alpha^j$, (j=0, 1, 2, ..., c−1)) of the evaluation value, the corresponding polynomial may be the reminder of $\alpha^j$ divided by the primitive polynomial p(x). The reminder (i.e., the corresponding polynomial) may include one or more powers of the primitive element that do not exceed the degree of $\alpha^3$. The reminder may correspond to a 4-bit binary string. Therefore, the mod operator may transform each bit of the evaluation value to a corresponding polynomial including one or more powers of the primitive element α. The corresponding polynomial may correspond to a 4-bit value (i.e., 4-bit binary string). The mod operator may then sum the polynomials corresponding to all the c bits of the evaluation value to produce a summation value. Since the polynomials corresponding to all c bits of the evaluation value correspond to c 4-bit values, the summation value corresponding to the evaluation value may correspond to a 4-bit value.

For example, FIG. 13 is a table illustrating exemplary representations for elements of GF($2^4$) according to some embodiments of the present disclosure. The primitive polynomial of GF($2^4$) may be represented as $p(x)=1+x+x^4$. As illustrated in FIG. 13, an element (or a value) may include three forms of representation in GF($2^4$). An element may correspond to a power representation (as illustrated in the first column of the table), a polynomial representation (as illustrated in the second column of the table), and a 4-tuple representation (or referred to as a 4-bit representation) (as illustrated in the third column of the table). As illustrated in FIG. 13, the most significant bit of a 4-bit binary string corresponds to the leftmost bit of the 4-bit binary string. For example, $\alpha^0$ (i.e., 1) may correspond to a 4-bit binary string (0 0 0 1), a may correspond to a 4-bit binary string (0 0 1 0), $\alpha^2$ may correspond to a 4-bit binary string (0 1 0 0), and $\alpha^3$ may correspond to a 4-bit binary string (1 0 0 0). If the power corresponding to a value (e.g., a bit of an evaluation value) exceeds the highest-degree power $\alpha^3$, the value may correspond to a binary string that includes more than four bits. The mod operator may transform the value back to a 4-bit value by performing the modulo operation on the value. For example, a value $\alpha^4$ may correspond to a 5-bit binary string (1 0 0 0 0), which exceeds the 4-bit limits of GF($2^4$). The mod operator may perform the modulo operation on the $\alpha^4$ with respect to the primitive polynomial $p(x)=1+x+x^4$. $\alpha^4$ may be converted to a polynomial 1+a (the reminder after division of $\alpha^4$ by the primitive polynomial p(x)). The polynomial 1+α may correspond to a 4-bit binary string (0 0 1 1). Thus the value $\alpha^4$ of five bits may be transformed back to a value of four bits.

In some embodiments, when performing the modulo operation on an evaluation value (e.g., the evaluation value $\lambda(\alpha^i)$), the corresponding mod operator (e.g., the mod operator 1214-1) may firstly sum the powers of the primitive element α corresponding to all bits of the evaluation value to produce a polynomial. For example, the evaluation value may include c bits, where c is an appropriate positive integer and is greater than m. The c bits of the evaluation value may be represented as $(e_{c-1}, \ldots, e_2, e_1, e_0)$. A bit $e_j$ (j=0, 1, 2, ..., c−1) may be in bit position j. The bit $e_1$ may correspond to $\alpha^j$. The mod operator may sum c powers of the primitive element α, i.e., $\alpha^0, \alpha^1, \alpha^2, \ldots, \alpha^{c-1}$, to produce a polynomial $\alpha^0+\alpha^1+\alpha^2+\ldots+\alpha^{c-1}$. The mod operator may then find the reminder of the polynomial $\alpha^0+\alpha^1+\alpha^2+\ldots+\alpha^{c-1}$ divided by the primitive polynomial of GF($2^m$). The reminder may include one or more powers of the primitive element α that do not exceed the highest-degree power of GF($2^m$) (i.e., $\alpha^{m-1}$). The reminder corresponding to the evaluation value may correspond to an m-bit binary string. Therefore, the mod operator may transform the evaluation value to an m-bit value.

When performing the modulo operation on the evaluation values (e.g., the evaluation value $\lambda(\alpha^i)$, the evaluation value $\lambda(\alpha^{(p-1)i})$) by implementing the above described process, the Chien search circuit 1200 may transform the (p−1) evaluation values to m-bit (e.g., 4-bit of GF($2^4$)) values in each cycle. For example, as illustrated in FIG. 12, in each cycle, the mod operator 1214-1 may transform the evaluation value $\lambda(\alpha^i)$ of (m+t) bits to an m-bit value. As another example, the mod operator 1214-(p-1) may transform the evaluation value $\lambda(\alpha^{(p-1)i})$ of m+t*(p-1) bits to an m-bit value. In each cycle, the BCH decoder 116 may evaluate the error locator polynomial based on the m-bit values. For example, if the m-bit evaluation value $\lambda(\alpha^i)$ obtained by the mod operator 1214-1 is equal to zero, the mod operator 1214-1 may output a logic 0. Accordingly, the NOT gate 1208-1 may output a logic 1, which indicates that $\alpha^i$ is a root of the error locator polynomial $\lambda(x)$. The BCH decoder 116 may then identify that the bit in bit position n-i is an erroneous bit. If the m-bit evaluation value $\lambda(\alpha^i)$ obtained by the mod operator 1214-1 is not equal to zero, the mod operator 1214-1 may output a logic 1. Accordingly, the NOT gate 1208-1 may output a logic 0, which indicates that $\alpha^i$ is not a root of the error locator polynomial $\lambda(x)$. The BCH decoder 116 may then determine that an error is not detected in bit position n-i.

The evaluation of the error locator polynomial implemented by the Chien search circuit 1200 may be similar to that of the Chien search architecture 1100 (and/or the Chien search circuit 1000), and the descriptions thereof are not repeated here.

It should be noted that above description is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure. For example, the t initial elements may be determined by the t registers of the Chien search circuit 1200 (or the Chien search circuit 1000, the Chien search circuit 1100, or the Chien search circuit 900). The t initial elements determined during the first time interval may be stored in the t registers of the Chien search circuit 1200, which may be used in the second time interval. During the second time interval of evaluating the error locator polynomial, the BCH decoder 116 may firstly update the t initial elements stored in the t registers of the Chien search circuit 1200 to be the t initial values.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by the present disclosure and are within the spirit and scope of the exemplary embodiments of the present disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "unit," "module," or "system." Furthermore, aspects of the present disclosure may take the form of a computer program product embodied in one or more computer-readable media having computer readable program code embodied thereon.

A computer readable signal medium may include a propagated data signal with computer readable program code embodied therein, for example, in baseband or as part of a carrier wave. Such a propagated signal may take any of a variety of forms, including electromagnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object-oriented programming language such as Java, Scala, Smalltalk, Eiffel, JADE, Emerald, C++, C #, VB. NET, Python or the like, conventional procedural programming languages, such as the "C" programming language, Visual Basic, Fortran 2103, Perl, COBOL 2102, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations, therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software-only solution, for example, an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various inventive embodiments. This method of disclosure, however, is not to be interpreted as reflecting an intention that the claimed subject matter requires more features than are expressly recited in each claim. Rather, inventive embodiments lie in less than all features of a single foregoing disclosed embodiment.

In some embodiments, the numbers expressing quantities or properties used to describe and claim certain embodiments of the application are to be understood as being modified in some instances by the term "about," "approximate," or "substantially." For example, "about," "approximate," or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

We claim:

1. A method for decoding a Bose-Chaudhuri-Hocquenghem (BCH) encoded codeword, the method comprising:
    receiving a codeword over a data channel, the codeword having a first number of data bits, the first number being not greater than a preset value;
    determining a plurality of syndrome values for the codeword during a first time interval;
    determining a set of initial elements during the first time interval, the set of initial elements being powers of a primitive element which are determined by a difference between the preset value and the first number;
    generating an error locator polynomial based on the plurality of syndrome values, the error locator polynomial representing one or more errors in the codeword;
    evaluating, based on the set of initial elements, the error locator polynomial to identify one or more error locations corresponding to the one or more errors in the codeword; and
    correcting the codeword based on the one or more error locations.

2. The method of claim 1, wherein determining the plurality of syndrome values for the codeword during the first time interval further includes:
    determining, in each cycle of a plurality of first cycles within the first time interval, an intermediate syndrome value corresponding to a first preset number of data bits of the codeword, the plurality of first cycles being determined by a ratio of the first number and the first preset number; and
    determining each of the plurality of syndrome values based on the intermediate syndrome value corresponding to the first number of data bits.

3. The method of claim 2, wherein determining the set of initial elements during the first time interval further includes:
    initializing a set of first registers to a set of values, each first register corresponding to one of the set of initial elements;
    determining, based on the first preset number of data bits, a power of the primitive element corresponding to each first register;
    for each cycle of a plurality of first cycles within the first time interval,
        updating each first register by multiplying a current value of the first register with the power of the primitive element corresponding to the first register; and
    determining the set of initial elements based on the values of the set of first registers updated in the last cycle of the plurality of first cycles.

4. The method of claim 3, wherein the first number is smaller than the preset value, and the number of the plurality of first cycles is smaller than a ratio of the difference between the preset value and the first number to the first preset number of data bits.

5. The method of claim 1, wherein evaluating the error locator polynomial to identify one or more error locations corresponding to the one or more errors in the codeword includes:
    determining, in each cycle of a plurality of second cycles, a second preset number of values, wherein each of the second preset number of values corresponds to one data bit of the codeword, and the plurality of second cycles are determined by a ratio of the first number and the second preset number; and
    evaluating, based on the second preset number of values, the error locator polynomial to identify one or more error locations corresponding to the one or more errors in the codeword.

6. The method of claim 5,
    wherein evaluating the error locator polynomial to identify one or more error locations corresponding to the one or more errors in the codeword includes:
        initializing a set of second registers to a set of initial values, the set of initial values being associated with the set of initial elements and a set of coefficients of the error locator polynomial;

wherein determining one of the second preset number of values in a second cycle includes:
  determining values of the set of second registers, a value of each second register being determined by multiplying the initial value of the second register and a corresponding power of a primitive element;
  multiplying the value of each second register with a corresponding power of the primitive element to produce a set of products;
  summing the set of products with a coefficient of the error locator polynomial to produce an evaluation value of the error locator polynomial; and
  determining the one of the second preset number of values in the second cycle based on the evaluation value.

7. The method of claim 6, wherein:
multiplying the value of each second register with the corresponding power of the primitive element includes:
  shifting the value of the second register by a number of bits associated with the corresponding power of the primitive element; and
summing the set of products with a coefficient of the error locator polynomial to produce an evaluation value of the error locator polynomial includes:
  summing the shifted values of the second registers with the coefficient of the error locator polynomial to produce the evaluation value of the error locator polynomial.

8. The method of claim 7, further comprising:
performing, based on a primitive polynomial, a modulo operation on the evaluation value of the error locator polynomial to transform the evaluation value to a preset number of hit value.

9. The method of claim 8, wherein performing the modulo operation on the evaluation value includes:
  mapping each bit of the evaluation value to a corresponding polynomial including one or more powers of the primitive element based on a position of the bit in the evaluation value; and
  summing polynomials corresponding to all bits of the evaluation value to produce a summation value.

10. The method of claim 1, wherein identifying the one or more error locations corresponding to the one or more errors in the codeword includes:
  determining, for each of the first number of data bits, a corresponding value of the error locator polynomial to identify the one or more error locations corresponding to the one or more errors in the codeword.

11. A decoder for decoding a Bose-Chaudhuri-Hocquenghem (BCH) encoded codeword, the decoder comprising:
  a receiving module configured to receive a codeword over a data channel, the codeword having a first number of data bits, the first number is not greater than a preset value;
  a syndrome calculation module configured to determine a plurality of syndrome values for the codeword during a first time interval;
  an error locator polynomial module configured to generate an error locator polynomial based on the plurality of syndrome values, the error locator polynomial representing one or more errors in the codeword;
  an error location determination module configured to determine a set of initial elements during the first time interval, the set of initial elements being powers of a primitive element which are determined by a difference between the preset value and the first number; and
  evaluate, based on the set of initial elements, the error locator polynomial to identify one or more error locations corresponding to the one or more errors in the codeword; and
  an error correction module configured to correct the codeword based on the one or more error locations.

12. The decoder of claim 11, wherein to determine the plurality of syndrome values, the syndrome calculation module is configured to:
  determine, in each cycle of a plurality of first cycles within the first time interval, an intermediate syndrome value corresponding to a first preset number of data bits of the codeword, the plurality of first cycles being determined by a ratio of the first number and the first preset number; and
  determine each of the plurality of syndrome values based on the intermediate syndrome value corresponding to the first number of data bits.

13. The decoder of claim 12, wherein to determine the set of initial elements during the first time interval, the syndrome calculation module is configured to:
  initialize a set of first registers to a set of values, each first register corresponding to one of the set of initial elements;
  determine, based on the first preset number of data bits, a power of the primitive element corresponding to each first register;
  for each cycle of the plurality of first cycles within the first time interval,
  update each first register by multiplying a current value of the first register with the of the primitive element corresponding to the first register; and
  determine the set of initial elements based on the updated values of the set of first registers updated in the last cycle of the plurality of first cycles.

14. The decoder of claim 13, wherein the first number is smaller than the preset value, and the number of the plurality of first cycles is smaller than a ratio of the difference between the preset value and the first number to the first preset number of data bits.

15. The decoder of claim 11, wherein to evaluate the error locator polynomial to identify one or more error locations corresponding to the one or more errors in the codeword, the error location determination module is configured to:
  determine, in each cycle of a plurality of second cycles, a second preset number of values, wherein each of the second preset number of values corresponds to one data bit of the codeword, and the plurality of second cycles are determined by a ratio of the first number and the second preset number; and
  evaluate, based on the second number of values, the error locator polynomial to identify one or more error locations corresponding to the one or more errors in the codeword.

16. The decoder of claim 15,
wherein to evaluate the error locator polynomial to identify one or more error locations corresponding to the one or more errors in the codeword, the error location determination module is configured to:
  initialize a set of second registers to a set of initial values, the set of initial values being associated with the set of initial elements and a set of coefficients of the error locator polynomial;

wherein to determine one of the second preset number of values in a second cycle, the error location determination module is configured to:

determine values of the set of second registers, a value of each second register being determined by multiplying the initial value of the second register and a corresponding power of a primitive element;

multiply the value of each second register with a corresponding power of a primitive element to produce a set of products;

sum the set of products with a coefficient of the error locator polynomial to produce an evaluation value of the error locator polynomial; and determine the one of the second preset number of values in the second cycle based on the evaluation value.

17. The decoder of claim 16, wherein:

to multiply the value of each second register with the corresponding power of the primitive element includes:
to shift the value of the second register by a number of bits associated with the corresponding power of the primitive element; and to sum the set of products with a coefficient of the error locator polynomial to produce an evaluation value of the error locator polynomial includes:
to sum the shifted values of the second registers with the coefficient of the error locator polynomial to produce the evaluation value of the error locator polynomial.

18. The decoder of claim 17, further comprising:

to perform, based on a primitive polynomial, a modulo operation on the evaluation value of the error locator polynomial to transform the evaluation value to a preset number of bit values.

19. The decoder of claim 18, wherein to perform the modulo operation on the evaluation value includes to:

map each bit of the evaluation value to a corresponding polynomial including one or more powers of the primitive element based on a position of the bit in the evaluation value; and sum polynomials corresponding to all bits of the evaluation value to produce a summation value.

20. The decoder of claim 11, wherein to identify the one or more error locations corresponding to the one or more errors in the codeword, the error location determination module is configured to:

determine, for each of the first number of data bits, a corresponding value of the error locator polynomial to identify the one or more error locations corresponding to the one or more errors in the codeword.

\* \* \* \* \*